(12) United States Patent
Park et al.

(10) Patent No.: US 10,133,130 B2
(45) Date of Patent: Nov. 20, 2018

(54) LIQUID CRYSTAL DISPLAY DEVICE

(71) Applicant: Samsung Display Co., Ltd., Yongin-si (KR)

(72) Inventors: Keun Woo Park, Incheon (KR); Jang Il Kim, Asan-si (KR); Su Wan Woo, Osan-si (KR); Yeo Geon Yoon, Suwon-si (KR); Tae Kyung Yim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/370,227

(22) Filed: Dec. 6, 2016

(65) Prior Publication Data

US 2018/0011378 A1    Jan. 11, 2018

(30) Foreign Application Priority Data

Jul. 6, 2016    (KR) ........................ 10-2016-0085280

(51) Int. Cl.

| | |
|---|---|
| *H01L 27/14* | (2006.01) |
| *H01L 29/04* | (2006.01) |
| *G02F 1/1343* | (2006.01) |
| *H01L 27/12* | (2006.01) |
| *G02F 1/1337* | (2006.01) |

(Continued)

(52) U.S. Cl.
CPC .... *G02F 1/134309* (2013.01); *G02F 1/13439* (2013.01); *G02F 1/133707* (2013.01); *H01L 27/124* (2013.01); *G02F 1/137* (2013.01); *G02F 1/1368* (2013.01); *G02F 1/133514* (2013.01); *G02F 2001/133357* (2013.01); *G02F 2001/136218* (2013.01); *G02F 2201/121* (2013.01); *G02F 2201/123* (2013.01)

(58) Field of Classification Search
None
See application file for complete search history.

(56) References Cited

U.S. PATENT DOCUMENTS

2007/0046877 A1 *  3/2007  Lin ................... G02F 1/133707
                                                       349/129
2008/0180625 A1 *  7/2008  Liu ................... G02F 1/133753
                                                       349/143

(Continued)

FOREIGN PATENT DOCUMENTS

| EP | 2520974 | 11/2012 |
|---|---|---|
| KR | 10-2017-0053794 | 5/2017 |
| KR | 10-2017-0119755 | 10/2017 |

OTHER PUBLICATIONS

European Search Report dated Oct. 25, 2017, for European application No. 17180124.4.

*Primary Examiner* — Nishath Yasmeen
(74) *Attorney, Agent, or Firm* — H.C. Park & Associates, PLC

(57) ABSTRACT

A liquid crystal display device is provided. A liquid crystal display device comprising, a substrate, and a pixel electrode disposed on the substrate, wherein the pixel electrode includes first cutout portions, which are disposed along edges of the pixel electrode, and second cutout portions, which are disposed closer than the first cutout portions to a center of the pixel electrode, and each of the second cutout portions includes first and second extensions, which extend in different directions and are connected to each other.

18 Claims, 20 Drawing Sheets

(51) Int. Cl.
   *G02F 1/1335*   (2006.01)
   *G02F 1/1368*   (2006.01)
   *G02F 1/137*    (2006.01)
   *G02F 1/1333*   (2006.01)
   *G02F 1/1362*   (2006.01)

(56) References Cited

U.S. PATENT DOCUMENTS

| | | |
|---|---|---|
| 2012/0281173 A1 | 11/2012 | Kwon et al. |
| 2013/0093987 A1* | 4/2013 | Kang ................ G02F 1/133707 349/141 |
| 2013/0242219 A1 | 9/2013 | Yun et al. |
| 2014/0253859 A1* | 9/2014 | Yoon ................ G02F 1/134336 349/144 |
| 2015/0055040 A1 | 2/2015 | Kwon et al. |
| 2015/0116620 A1* | 4/2015 | Song ................ G02F 1/134309 349/43 |
| 2017/0131595 A1 | 5/2017 | Yim et al. |
| 2017/0299924 A1 | 10/2017 | Yim et al. |

* cited by examiner

LIQUID CRYSTAL DISPLAY DEVICE

CROSS-REFERENCE TO RELATED APPLICATION

This application claims priority from and the benefit of Korean Patent Application No. 10-2016-0085280, filed on Jul. 6, 2016, which is hereby incorporated by reference for all purposes as if fully set forth herein.

BACKGROUND

Field

Exemplary embodiments relate to a liquid crystal display (LCD) device.

Discussion of the Background

A liquid crystal display (LCD) device, which is one of the most widely-used display devices, includes two substrates on which field-generating electrodes such as pixel electrodes and a common electrode are formed, and a liquid crystal layer which is inserted between the two substrates. The LCD device generates an electric field in the liquid crystal layer by applying voltages to the field-generating electrodes and displays an image by determining the orientation of liquid crystal molecules in the liquid crystal layer and controlling the polarization of incident light using the electric field.

Particularly, a vertical alignment (VA)-mode LCD device has been developed, which aligns liquid crystal molecules such that the long axes of the liquid crystal molecules are perpendicular to upper and lower substrates in the absence of an electric field.

However, the VA-mode LCD device may have poor side visibility when compared to its front visibility. More specifically, the VA-mode LCD device may appear brighter when viewed from the front than when viewed from a side, and the greater the difference between the brightness of the VA-mode LCD device as viewed from the front and the brightness of the VA-mode LCD device as viewed from a side is, the poorer the visibility of the VA-mode LCD device becomes.

Thus, a structure is needed to minimize the difference between the brightness of the VA-mode LCD device as viewed from the front and the brightness of the VA-mode LCD device as viewed from a side to improve the visibility of the VA-mode LCD device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a liquid crystal display (LCD) device with an improved visibility.

Additional aspects will be set forth in the detailed description which follows, and, in part, will be apparent from the disclosure, or may be learned by practice of the inventive concept.

An exemplary embodiment discloses a liquid crystal display device that includes a substrate and a pixel electrode disposed on the substrate, wherein the pixel electrode includes first cutout portions which are disposed along edges of the pixel electrode, and second cutout portions which are disposed closer than the first cutout portions to a center of the pixel electrode, and where each of the second cutout portions includes first and second extensions which extend in different directions and are connected to each other.

Another exemplary embodiment discloses a liquid crystal display device that includes a substrate and a pixel electrode disposed on the substrate, wherein the pixel electrode includes first cutout portions which are disposed adjacent to, and extend along, at least one edge of the pixel electrode, and second cutout portions which are disposed on the inside of the first cutout portions. Each of the second cutout portions includes a plurality of first extensions, which extend in a first direction in parallel to one another and are spaced apart from one another, and a second extension, which is connected to first ends of the first extensions and extends in a second direction that is perpendicular to the first direction.

According to the exemplary embodiments, an LCD device with an improved visibility can be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
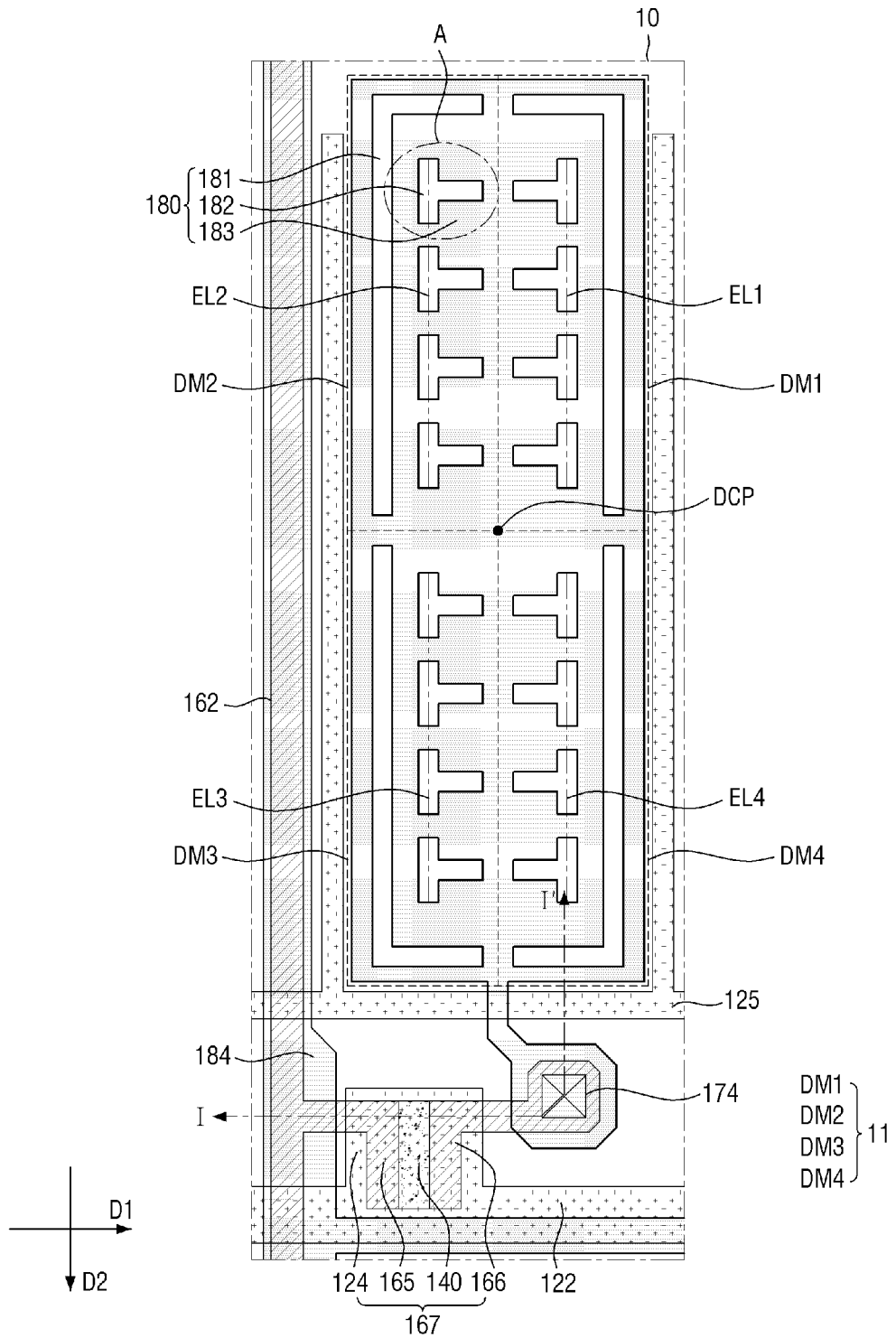
FIG. 1 is a plan view of a pixel of a liquid crystal display (LCD) device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, preferred embodiments of the present invention will be described in detail with reference to the attached drawings.

Figure 2:
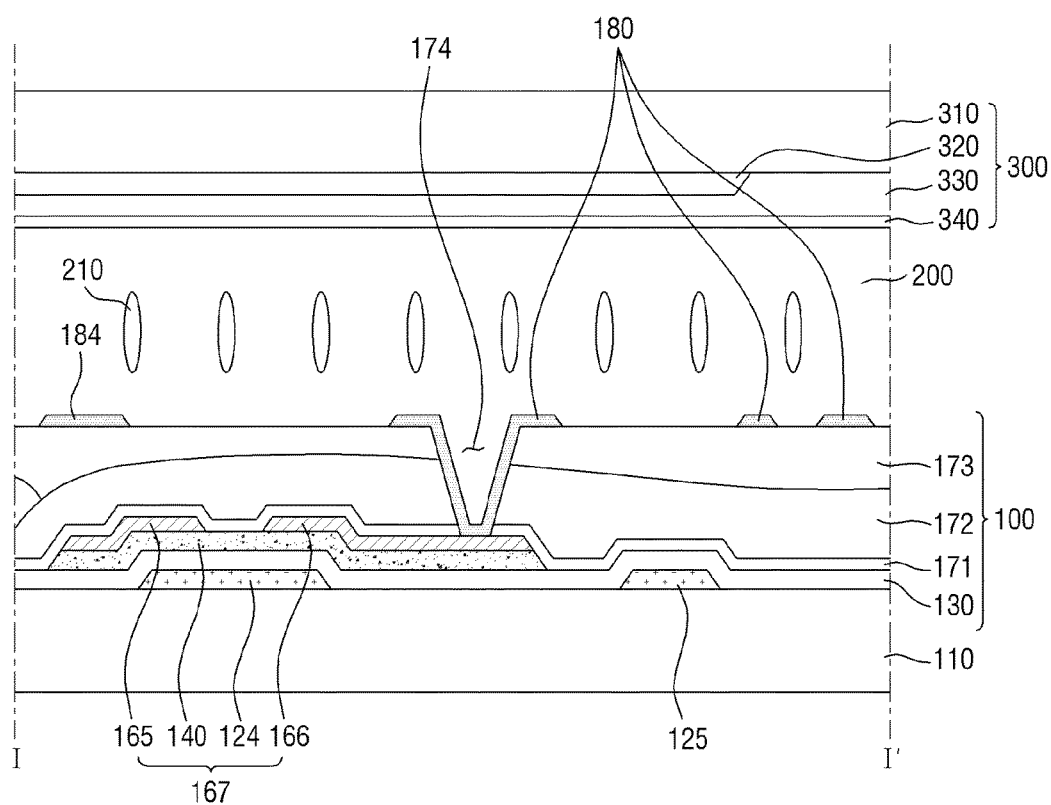
FIG. 2 is a cross-sectional view taken along line I-I' of FIG. 1.
Figure 3:
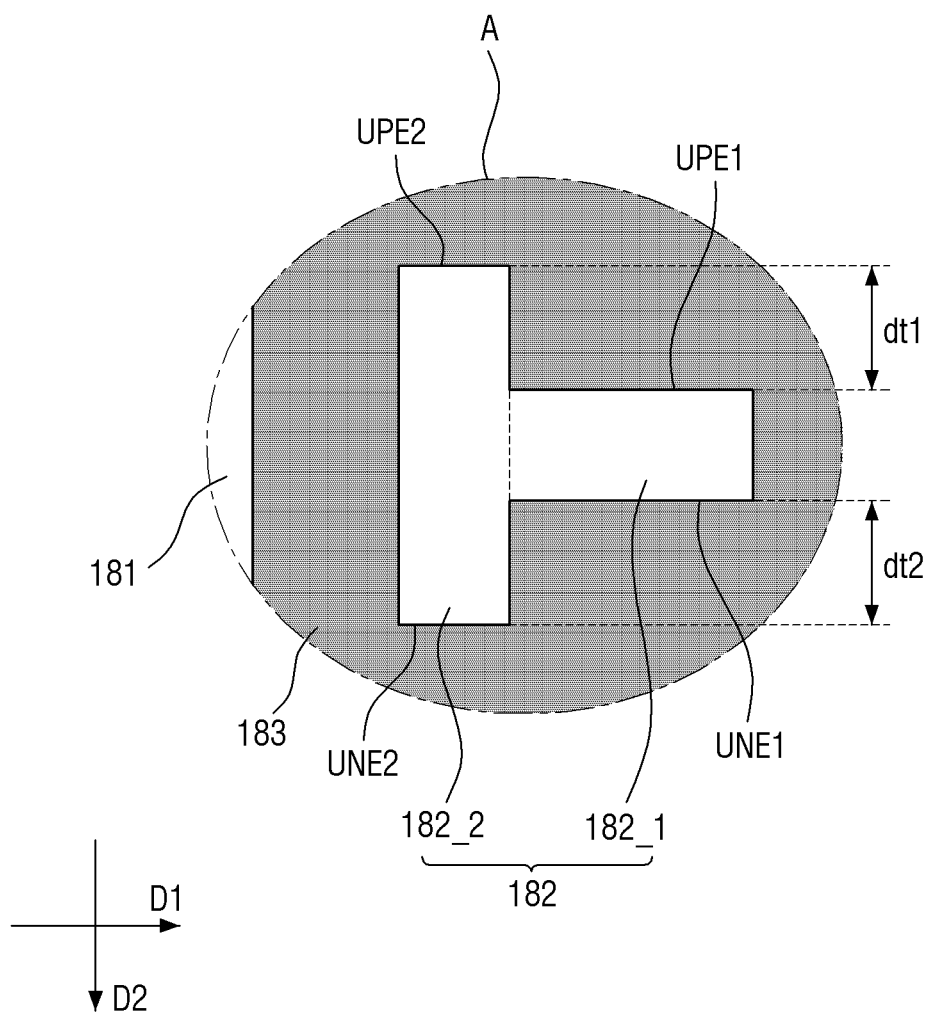
FIG. 3 is an enlarged plan view of an area A of FIG. 1.

FIG. 1 is a plan view of a pixel of a liquid crystal display (LCD) device according to an exemplary embodiment of the present disclosure, FIG. 2 is a cross-sectional view taken along line I-I' of FIG. 1, and FIG. 3 is an enlarged plan view of an area A of FIG. 1.

Referring to FIGS. 1 through 3, the LCD device according to the present exemplary embodiment may include a first display substrate 100, a second display substrate 300, and a liquid crystal layer 200. The LCD device according to the present exemplary embodiment may further include a pair of polarizers (not illustrated), which are attached on the outer surfaces of the first and second display substrates 100 and 300.

A switching device for driving liquid crystal molecules 210 in the liquid crystal layer 200, for example, a thin-film transistor (TFT) 167, may be disposed on the first display substrate 100. The second display substrate 300 is a counter substrate disposed to face the first display substrate 100.

The liquid crystal layer 200 may be interposed between the first and second display substrates 100 and 300, and may include the liquid crystal molecules 210, which have dielectric anisotropy. In response to an electric field being applied between the first and second display substrates 100 and 300, the liquid crystal molecules 210 may rotate in a particular direction between the first and second display substrates 100 and 300 so as to allow or block the transmission of light through the liquid crystal layer 200. The term "rotation of the liquid crystal molecules 210," as used herein, means that the alignment of the liquid crystal molecules 210 changes due to an electric field.

The device according to the present exemplary embodiment may include more than one pixel 10, which are arranged in a matrix. The gray level of the pixel 10 may be independently controllable. The pixel 10 may be a basic unit for displaying a particular color. The pixel 10 may include an active region 11, which transmits light incident thereupon from the bottom of the first display substrate 100 therethrough toward the top of the second display substrate 300 and actually displays a color.

The first display substrate 100 will hereinafter be described.

The first display substrate 100 may include a first base substrate 110. The first base substrate 110 may be a transparent insulating substrate. For example, the first base substrate 110 may be a glass substrate, a quartz substrate, or a transparent resin substrate.

In some exemplary embodiments, the first base substrate 110 may be curved along a particular direction. In some other exemplary embodiments, the first base substrate 110 may have flexibility. That is, the first base substrate 110 may be deformable through rolling, folding, or bending.

A gate line 122, a gate electrode 124, and a sustain line 125 may be disposed on the first base substrate 110.

The gate line 122 may transmit a gate voltage, which controls the TFT 167. The gate line 122 may extend in a first direction D1.

The first direction D1 may be a direction parallel to one side of the first base substrate 110 on a plane where the first base substrate 110 is disposed, and may be defined as a direction indicated by an arbitrary straight line extending from the left to the right of FIG. 1. However, the first direction D1 is not particularly limited to being parallel to one side of the first base substrate 110, but may be a direction indicated by a straight line extending across the first base substrate 110 in any particular direction.

The gate voltage may be provided by an external source and may have a variable level. The turning on or off of the TFT 167 may be controlled by the level of the gate voltage.

The gate electrode 124 may be formed to protrude from the gate line 122 and may be connected to the gate line 122. The gate electrode 124 may be one of the elements of the TFT 167.

The sustain line 125 may be disposed between the gate line 122 and another gate line 122. The sustain line 125 may substantially extend in the first direction D1 and may also extend along the edges of the active region 11. The sustain line 125 may be disposed to be adjacent to the edges of a pixel electrode 180 that will be described later, and a predetermined capacitance may be formed between the pixel electrode 180 and the sustain line 125. Accordingly, a sudden drop in the level of a voltage applied to the pixel electrode 180 may be prevented. The sustain line 125 may not be provided if a voltage drop in the pixel electrode 180 does not much affect the display quality of the LCD device according to the present exemplary embodiment.

The gate line 122, the gate electrode 124, and the sustain line 125 may be formed of the same material. For example, the gate line 122, the gate electrode 124, and the sustain line 125 may comprise aluminum (Al), an Al-based metal such as an Al alloy, silver (Ag), a Ag-based metal such as a Ag alloy, copper (Cu), a Cu-based metal such as a Cu alloy, molybdenum (Mo), a Mo-based metal such as a Mo alloy, chromium (Cr), tantalum (Ta), titanium (Ti), or the like. The gate line 122, the gate electrode 124, and the sustain line 125, may have a single-layer structure or may have a multilayer structure including two conductive films having different physical properties.

A gate insulating layer 130 is disposed on the gate line 122, the gate electrode 124, and the sustain line 125. The gate insulating layer 130 may be formed of an insulating material. For example, the gate insulating layer 130 may be formed of silicon nitride or silicon oxide. The gate insulating layer 130 may have a single-layer structure or a multilayer structure including two insulating films having different physical properties.

A semiconductor layer 140 may be disposed on the gate insulating layer 130. The semiconductor layer 140 may at least partially overlap the gate electrode 124. The semiconductor layer 140 may be formed of amorphous silicon, polycrystalline silicon, or an oxide semiconductor.

The semiconductor layer 140 may overlap the gate electrode 124, and may also overlap a data line 162, a source electrode 165, and a drain electrode that will be described later.

Although not specifically illustrated, in some exemplary embodiments, ohmic contact members may be additionally provided on the semiconductor layer 140. The ohmic contact members may be formed of silicide or n+ hydrogenated amorphous silicon doped with a high concentration of n-type impurities. The ohmic contact members may be disposed on the semiconductor layer 140 in a pair. The ohmic contact members, which are disposed among the source electrode 165, the drain electrode 166, and the semiconductor layer 140, may enable the source electrode 165, the drain electrode 166, and the semiconductor layer 140 to have ohmic contact properties. In a case in which the semiconductor layer 140 includes an oxide semiconductor, the ohmic contact members may not be provided.

The data line 162, the source electrode 165, and the drain electrode 166 may be disposed on the semiconductor layer 140 and the gate insulating layer 130.

The data line 162 may extend in a second direction D2 and may intersect the gate line 122.

The second direction D2 may be a direction that intersects the first direction D1 on the plane where the first base substrate 110 is disposed. For example, the second direction D2 may be a direction indicated by an arbitrary straight line extending from the top to the bottom of FIG. 1. In some exemplary embodiments, the first and second directions D1 and D2 may cross each other at a right angle.

The data line 162 may be insulated from the gate line 122 and the gate electrode 124 by the gate insulating layer 130.

The data line 162 may provide a data voltage to the source electrode 165. The data voltage may be provided by an external source and may have a variable level. The gray level of the pixel 10 may vary depending on the level of the data voltage.

The source electrode 165 may be branched off from the data line 162 and may at least partially overlap the gate electrode 124.

In the view of FIG. 1, the drain electrode 166 may be spaced apart from the source electrode 165 over the semiconductor layer 140 and may partially overlap the gate electrode 124.

As illustrated in FIG. 1, the source electrode 165 may be a predetermined distance apart from, and extend in parallel to, the drain electrode 166, but the present disclosure is not limited thereto. For example, the source electrode 165 may extend in a "C" shape and may surround the drain electrode 166 with a predetermined gap therebetween without departing from the scope of the present inventive concept.

The data line 162, the source electrode 165, and the drain electrode 166 may be formed of the same material. For example, the data line 162, the source electrode 165, and the drain electrode 166 may be formed of Al, Cu, Ag, Mo, Cr, Ti, Ta or an alloy thereof. The data line 162, the source electrode 165, and the drain electrode 166 may have a multilayer structure including a lower film (not illustrated) formed of a refractory metal and a low-resistance upper film (not illustrated) formed on the lower film, but the present disclosure is not limited thereto.

The gate electrode 124, the semiconductor layer 140, the source electrode 165, and the drain electrode 166 may form the TFT 167, which is a switching device.

A passivation layer 171 may be disposed on the gate insulating layer 130 and the TFT 167. The passivation layer 171 may be formed of an inorganic insulating material and may be disposed to cover the TFT 167. The passivation layer 171 may protect the TFT 167 and may prevent the materials contained in a color filter layer 172 and a planarization layer 173 that will be described later from infiltrating into the semiconductor layer 140.

The color filter layer 172 may be disposed on the passivation layer 171. The color filter layer 172 may be formed of a photosensitive organic composition comprising a pigment for realizing a color, and the pigment may include any one of red, green, and blue pigments. For example, the color filter layer 172 may include a plurality of color filters. For example, each of the plurality of color filters may display any one of a number of primary colors such as red, green, and blue, but the present disclosure is not limited thereto. That is, in another example, each of the plurality of color filters may display any one of a cyan, magenta, yellow, and white color.

The planarization layer 173 is disposed on the color filter layer 172. The planarization layer 173 may be formed of an insulating material. For example, the planarization layer 173 may be an organic layer formed of an organic material. The planarization layer 173 may planarize any local height difference that may be generated by elements provided between the planarization layer 173 and the first base substrate 110. In other words, the top surface of the planarization layer 173 may be substantially flat.

A contact hole 174, which exposes part of the TFT 167, particularly, part of the drain electrode 166, in a direction perpendicular to the first base substrate 110, may be formed in the passivation layer 171, the color filter layer 172, and the planarization layer 173. The contact hole 174 may be formed to penetrate the passivation layer 171, the color filter layer 172, and the planarization layer 173 in the direction perpendicular to the first base substrate 110. The drain electrode 166 and the pixel electrode 180, which is disposed on the planarization layer 173, may be physically connected to each other via the contact hole 174.

The pixel electrode 180 and a shielding electrode 184 are disposed on the passivation layer 171. The pixel electrode 180 and the shielding electrode 184 may be disposed so as to not overlap each other on the same plane.

The pixel electrode 180 may be physically connected to the drain electrode 166 via the contact hole 174 and may be provided with the data voltage from the drain electrode 166.

The pixel electrode 180 may be formed of a transparent conductive material such as indium tin oxide (ITO), indium zinc oxide (IZO), indium tin zinc oxide (ITZO), or aluminum (Al)-doped zinc oxide (AZO).

The pixel electrode 180 may be disposed mostly in the active region 11. The pixel electrode 180 may extend beyond the active region 11 to be connected to the drain electrode 166 via the contact hole 174.

A region in which the pixel electrode 180 is disposed may be divided into a plurality of sub-regions. For example, the region in which the pixel electrode 180 is disposed may be divided into four sub-regions. That is, the active region 11 may be divided into four sub-regions. The four sub-regions may respectively correspond to the four quadrants of the active region 11, and the upper right, upper left, lower left, and lower right quadrants of the active region 11 may be defined as first, second, third, and fourth domains DM1, DM2, DM3, and DM4, respectively. The first, second, third, and fourth domains DM1, DM2, DM3, and DM4 may all have the same area and the same shape.

The pixel electrode 180 may be symmetrical with respect to a domain center DCP at which the first, second, third, and fourth domains DM1, DM2, DM3, and DM4 adjoin one another. In other words, the pixel electrode 180 may be symmetrical with respect to the boundary between the first and second domains DM1 and DM2 and the boundary between the third and fourth domains DM3 and DM4. Also, the pixel electrode 180 may be symmetrical with respect to the boundary between the second and third domains DM2 and DM3 and the boundary between the first and fourth domains DM1 and DM4.

The pixel electrode 180 may include an electrode portion 183 in which a transparent conductive material is provided and first cutout portions 181 and second cutout portions 182 in which the transparent conductive material is not provided. That is, the pixel electrode 180 may be generally in a plate shape formed by the electrode portion 183 with openings corresponding to the first cutout portions 181 and the second cutout portions 182. The direction in which the liquid crystal molecules 210, which are disposed to overlap the pixel electrode 180, are tilted may be controlled according to the shapes and patterns of the first cutout portions 181 and the second cutout portions 182.

The first cutout portions 181 may be disposed to be adjacent to, and extend along, the edges of the pixel electrode 180. That is, the first cutout portions 181 may be openings that are adjacent to, but a predetermined distance apart from, the edges of the pixel electrode 180, and extend in parallel to the edges of the pixel electrode 180.

The first cutout portions 181 may be disposed to be adjacent to all the edges of the pixel electrode 180. A plurality of first cutout portions 181 may be formed so as to connect part of the electrode portion 183 on the outside of the first cutout portions 181 and part of the electrode portion 183 on the inside of the first cutout portions 181. For example, the first cutout portions 181 may be separated from one another by the boundaries among the first, second, third, and fourth domains DM1, DM2, DM3, and DM4, and the pixel electrode 180 may include a total of four first cutout portions 181.

The edges of the pixel electrode 180 may extend substantially in the first direction D1 or the second direction D2, and the first cutout portions 181 may also extend substantially in the first direction D1 or the second direction D2.

By forming the first cutout portions 181 in the aforementioned manner, the influence of an electric field formed at or near the edges of the active region 11 may be controlled, and as a result, the direction in which the long axis of the liquid crystal molecules 210 are tilted at or near the edges of the active region 11 may be controlled. Particularly, in a case in which the pixel electrode 180 is driven in a low gray mode during which a relatively low data voltage is provided, the long axes of the liquid crystal molecules 210 may be controlled to be tilted along the first direction D1 due to the first cutout portions 181. As a result, the visibility of the LCD device according to the present exemplary embodiment may be improved.

The second cutout portions 182 may be disposed on the inside of the first cutout portions 181. That is, the second cutout portions 182 may be disposed closer than the first cutout portions 181 to the domain center DCP. More than one second cutout portion 182 may be disposed in each of the first, second, third, and fourth domains DM1, DM2, DM3, and DM4, and the second cutout portions 182 may be symmetrical with respect to the domain center DCP. Accordingly, the number of second cutout portions 182 may be the same in all the first, second, third, and fourth domains DM1, DM2, DM3, and DM4.

Each of the second cutout portions 182 may include first and second extensions 182_1 and 182_2, which extend in different directions and adjoin each other. The first extensions 182_1 may be openings extending in the first direction D1, and the second extensions 182_2 may be openings extending in the second direction D2.

The first extensions 182_1 may be disposed along the first direction D1 and may control the liquid crystal molecules 210 to be tilted along the second direction D2. More specifically, in the view of FIG. 1, first extensions 182_1 in the first and second domains DM1 and DM2 may control the long axes of the liquid crystal molecules 210 to be tilted downward, and first extensions 182_1 in the third and fourth domains DM3 and DM4 may control the long axes of the liquid crystal molecules 210 to be tilted upward.

In each of the first, second, third, and fourth domains DM1, DM2, DM3, and DM4, the first extensions 182_1 may be disposed in such a manner that their ends are disposed on a straight line, and may be in parallel to one another.

The second extensions 182_2 may be disposed along the second direction D2 and may control the liquid crystal molecules 210 to be tilted along the first direction D1. More specifically, in the view of FIG. 1, second extensions 182_2 in the first and fourth domains DM1 and DM4 may control the long axis of the liquid crystal molecules 210 to be tilted leftward, and second extensions 182_2 in the second and third domains DM2 and DM3 may control the long axes of the liquid crystal molecules 210 to be tilted rightward. This effect may be apparent, particularly at a low gray level. The direction in which the liquid crystal molecules 210 are tilted at a low gray level and the direction in which the liquid crystal molecules 210 are tilted at a high gray level will be described later in detail.

In each of the first, second, third, and fourth domains DM1, DM2, DM3, and DM4, the second extensions 182_2 may be disposed on an arbitrary straight line extending in the second direction D2. More specifically, the second extensions 182_2 in the first domain DM1 may be disposed on a first extension line EL1, the second extensions 182_2 in the second domain DM2 may be disposed on a second extension line EL2, the second extensions 182_2 in the third domain DM3 may be disposed on a third extension line EL3, and the second extensions 182_2 in the fourth domain DM4 may be disposed on a fourth extension line EL4.

The second extensions 182_2 may be disposed closer than the first extensions 182_1 to the edges of the pixel electrode 180, i.e., the outer sides of the active region 11. More specifically, in the view of FIG. 1, in the first and fourth domains DM1 and DM4, the second extensions 182_2 may be located further to the right than the first extensions 182_1, and in the second and third domains DM2 and DM3, the second extensions 182_2 may be located further to the left than the first extensions 182_1.

In a case in which the second extensions 182_2 are disposed in each of the first, second, third, and fourth domains DM1, DM2, DM3, and DM4 in series on a single straight line and are adjacent to the first cutout portions 181, the second extensions 182_2 may perform a similar function to that of the first cutout portions 181. That is, the second extensions 182_2 may operate as if they were a single opening extending in the second direction D2. Thus, the effect of providing additional first cutout portions 181 extending in the second direction D2 in addition to portions of the first cutout portions 181 extending in the second direction D2 may be achieved. Accordingly, the visibility of the LCD device according to the present exemplary embodiment at a low gray level may be improved due to the presence of the second extensions 182_2.

Since the second extensions 182_2 are not connected, but separated, from one another, the area of openings in the pixel electrode 180 may increase. Thus, a decrease in the transmittance of the LCD device according to the present exemplary embodiment may be minimized, and the control over the direction in which the long axes of the liquid crystal molecules 210 are tilted may be optimized. As a result, the transmittance of the LCD device according to the present exemplary embodiment may be improved.

The shielding electrode 184 may be disposed on the same layer as the pixel electrode 180. The shielding electrode 184 may be disposed to either adjoin the pixel electrode 180 or to be a predetermined distance apart from the pixel electrode 180, and may not be physically and electrically connected to the pixel electrode 180. Accordingly, the data voltage provided to the pixel electrode 180 may not be provided to the shielding electrode 184.

The shielding electrode 184 may be formed of a transparent conductive material such as ITO, IZO, ITZO, or AZO, and may comprise the same material as the pixel electrode 180.

The shielding electrode 184 may be disposed to overlap an entire non-active region except for a region where the pixel electrode 180 is provided, but the present disclosure is not limited thereto. That is, the shielding electrode 184 may not necessarily overlap the entire non-active region except for the region where the pixel electrode 180 is provided, but may overlap the non-active region except for some other regions.

The shielding electrode 184 may also be disposed to overlap the data line 162. Thus, the liquid crystal molecules 210, which are disposed to overlap the data line 162, may be prevented from being affected by the data voltage applied to the data line 162, and as a result, light leakage may be prevented.

A first alignment layer (not illustrated) may be disposed on the pixel electrode 180 and the shielding electrode 184. The first alignment layer may control the initial alignment angle of the liquid crystal molecules 210 injected into the liquid crystal layer 200.

The second display substrate 300 will hereinafter be described.

The second display substrate 300 may include a second base substrate 310, a light-shielding member 320, an overcoat layer 330, and a common electrode 340.

The second base substrate 310 may be disposed to face the first base substrate 110. The second base substrate 310 may be durable enough to withstand external shock. The second base substrate 310 may be a transparent insulating substrate. For example, the second base substrate 310 may be a glass substrate, a quartz substrate, a transparent resin substrate, or the like. The second base substrate 310 may be in the shape of a flat plate, or may be curved in a particular direction.

The light-shielding member 320 may be disposed on a surface of the second base substrate 310 that faces the first display substrate 100. In an exemplary embodiment, the light-shielding member 320 may be disposed to overlap the gate line 122, the data line 162, the TFT 167, and the contact hole 174. In other words, the light-shielding member 320 may be disposed to overlap the non-active region, which is a region other the active region 11, and may block the transmission of light in the non-active region. However, the present disclosure is not limited to these exemplary embodiments. That is, in some other exemplary embodiments, the light-shielding member 320 may be disposed in the entire non-active region except for part of the data line 162 near the pixel electrode 180, in which case, part of the data line 162 not overlapped by the light-shielding member 320 may be overlapped by the shielding electrode 184 to block the transmission of light therethrough.

The overcoat layer 330 may be disposed on a surface of the light-shielding member 320 that faces the first display substrate 100. The overcoat layer 330 may reduce any height difference generated by the light-shielding member 320. In an exemplary embodiment, the overcoat layer 330 may not be provided.

The common electrode 340 may be disposed on a surface of the overcoat layer 330 that faces the first display substrate 100.

The common electrode 340 may be formed of a transparent conductive material such as ITO, IZO, ITZO, or AZO.

The common electrode 340 may be formed on the entire surface of the second base substrate 310 as a plate. A common voltage provided by an external source may be applied to the common electrode 340, and the common electrode 340 may form an electric field in the liquid crystal layer 200 together with the pixel electrode 180.

The common voltage may be provided by an external source, and the level of the common voltage may be uniformly maintained while the LCD device according to the present exemplary embodiment is operating. Accordingly, an electric field may be formed in the space between the pixel electrode 180 and the common electrode 340, which are disposed to overlap each other, due to a difference in the data voltage and the common voltage applied to the pixel electrode 180 and the common electrode 340, respectively. Due to the electric field, the liquid crystal molecules 210 may rotate or tilt.

In an exemplary embodiment, a voltage having substantially the same level as the common voltage may be provided to the shielding electrode 184. Thus, no electric field with directivity may be formed in part of the liquid crystal layer 200 between the shielding electrode 184 and the common electrode 340, which are disposed to overlap each other, while the LCD device according to the present exemplary embodiment is operating, because the shielding electrode 184 and the common electrode 340 are provided with signals having the same voltage and thus no electric potential is generated therebetween. Accordingly, the liquid crystal molecules 210 may not rotate or tilt in the space between the shielding electrode 184 and the common electrode 340, which are disposed to overlap each other, and may maintain the same state as that in a case in which the LCD device according to the present exemplary embodiment is powered off. As a result, the liquid crystal molecules 210 may block the transmission of light.

A second alignment layer (not illustrated) may be disposed on a surface of the common electrode 340 that faces the first display substrate 100. The second alignment layer, like the first alignment layer, may control the initial alignment angle of the liquid crystal molecules 210 in the liquid crystal layer 200.

The liquid crystal layer 200 will hereinafter be described.

The liquid crystal layer 200 may include the liquid crystal molecules 210, which have dielectric anisotropy and refractive anisotropy. The liquid crystal molecules 210 may be aligned in a vertical direction with respect to the first and second display substrates 100 and 300 in the absence of an electric field in the liquid crystal layer 200. In response to an electric field being generated between the first and second display substrates 100 and 300, the liquid crystal molecules 210 may rotate, or may be tilted, in a particular direction between the first and second display substrates 100 and 300, thereby changing the polarization of light.

Referring to FIG. 3, a length dt1 between upper ends UPE1 and UPE2 of the first and second extensions 182_1 and 182_2 of each of the second cutout portions 182 may be the same as a length dt2 between lower ends UNE1 and UNE2 of the first and second extensions 182_1 and 182_2 of each of the second cutout portions 182. That is, in each of the second cutout portions 182, the first extension 182_1 may be disposed to be connected to the middle of the second extension 182_2.

The improvement of the visibility and transmittance of the LCD device according to the present exemplary embodiment will hereinafter be described.

Figure 4:
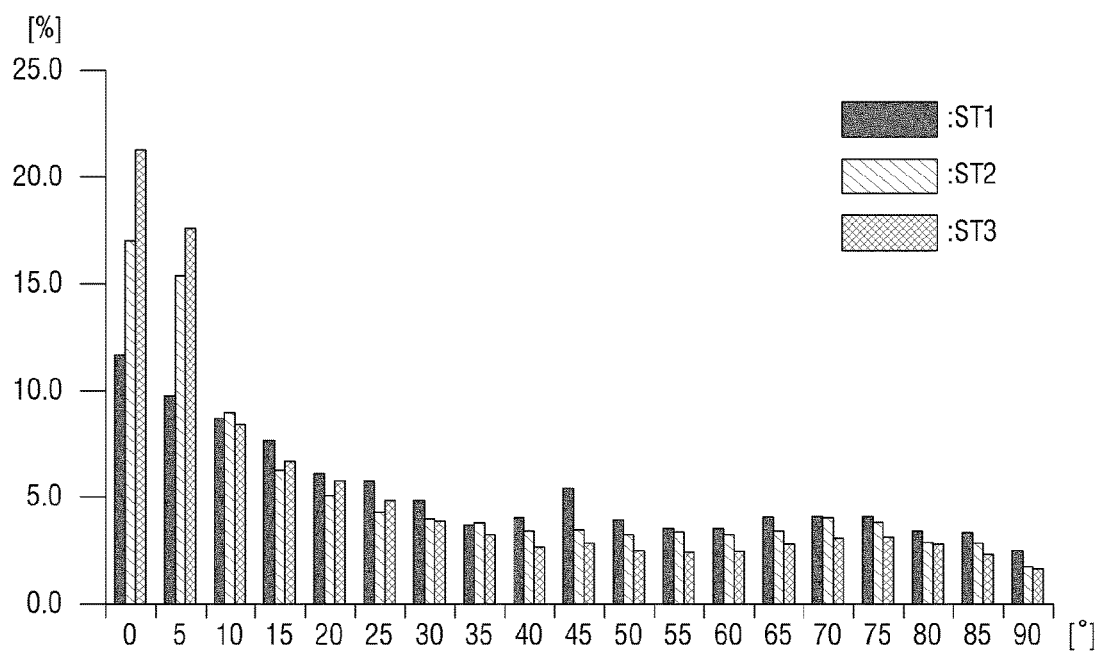
FIG. 4 is a graph showing the distributions of the long axes of liquid crystal molecules, at a low gray level, in the pixels of LCD devices according to first and second comparative examples and the pixel of the LCD device according to the exemplary embodiment of FIG. 1, respectively.

FIG. 4 is a graph showing the distributions of the long axis of liquid crystal molecules in the pixels of LCD devices according to first and second comparative examples and in the pixel of the LCD device according to the exemplary embodiment of FIG. 1, respectively, when the LCD devices according to first and second comparative examples and the LCD device according to the exemplary embodiment of FIG. 1 are all driven at a low gray level.

The LCD device according to the first comparative example has a pixel electrode which is in a cross shape with a plurality of minute electrodes extending radially from the center of the cross shape. The LCD device according to the second comparative example has a pixel electrode, which may include second cutout portions with no second extensions and consisting only of first extensions and has more second cutout portions than the pixel electrode 180 of the LCD device according to the exemplary embodiment of FIG. 1.

The expression "driven at a low gray level", as used herein, may denote a case in which the difference between the data voltage provided to the pixel electrode 180 and the common voltage provided to the common electrode 340 becomes smaller than when the LCD device according to the exemplary embodiment of FIG. 1 is driven at a high gray level.

The term "azimuth angle," as used herein, may denote an angle that a projection vector obtained by projecting a vector corresponding to the long axes of the liquid crystal molecules 210 onto the plane where the first display substrate 100 is disposed forms with the first direction D1. That is, in a plan view as illustrated in FIGS. 1 and 3, an angle that the long axes of the liquid crystal molecules 210 form with the first direction D1 may be defined as the azimuth angle of the liquid crystal molecules 210.

The azimuth angle of the liquid crystal molecules 210 is closely related to the visibility of the LCD device according to the exemplary embodiment of FIG. 1 as driven at a low gray level and is also closely related to the transmittance of the LCD device according to the exemplary embodiment of FIG. 1 as driven at a high gray level. More specifically, in a case in which the LCD device according to the exemplary embodiment of FIG. 1 is driven at a low gray level, the greater the number of liquid crystal molecules 210 having an azimuth angle close to 0° is, the smaller the difference between the brightness of the LCD device according to the exemplary embodiment of FIG. 1 as viewed from the front and the brightness of the LCD device according to the exemplary embodiment of FIG. 1 as viewed from a side becomes, and as a result, the better the visibility of the LCD device according to the exemplary embodiment of FIG. 1 becomes. On the other hand, in a case in which the LCD device according to the exemplary embodiment of FIG. 1 is driven at a high gray level, the greater the number of liquid crystal molecules 210 having an azimuth angle close to 45° is, the better the transmittance of the LCD device according to the exemplary embodiment of FIG. 1 becomes. Given all the above, FIGS. 4 and 5 can be interpreted as follows.

Figure 5:
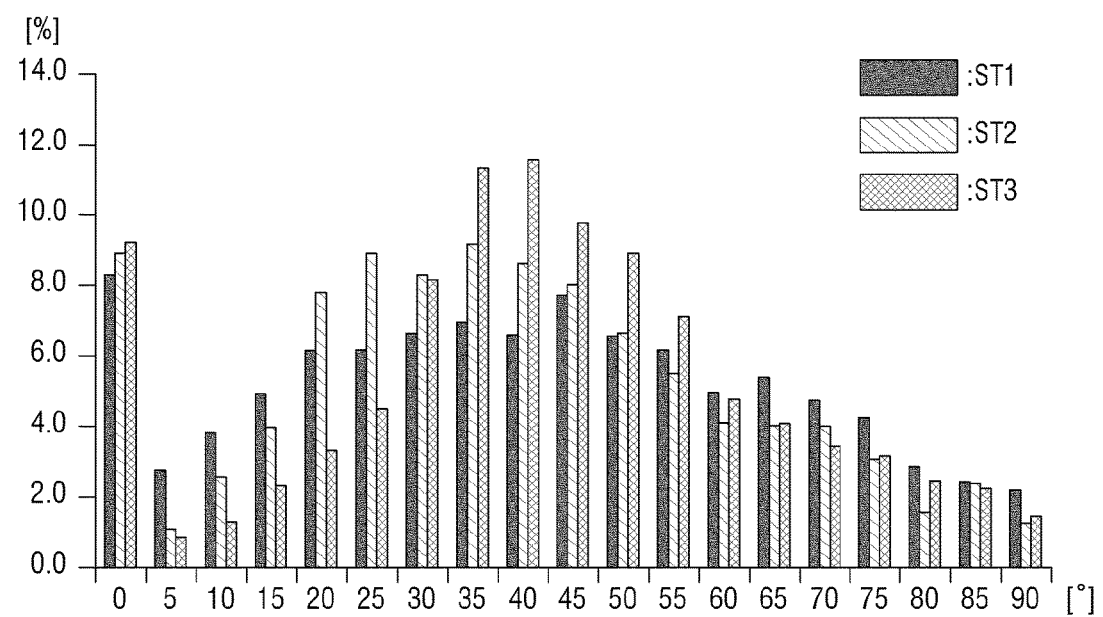
FIG. 5 is a graph showing the distributions of the long axis of liquid crystal molecules in the pixels of the LCD devices according to first and second comparative examples and the pixel of the LCD device according to the exemplary embodiment of FIG. 1, respectively, when the LCD devices according to first and second comparative examples and the LCD device according to the exemplary embodiment of FIG. 1 are all driven at a high gray level.

Referring to FIGS. 4 and 5, first bars ST1 represent measurements obtained from the LCD device according to the first comparative example, second bars ST2 represent measurements obtained from the LCD device according to the second comparative example, and third bars ST3 represent measurements obtained from the LCD device according to the exemplary embodiment of FIG. 1.

More specifically, when driven at a low gray level, the LCD device according to the second comparative example has a higher percentage of liquid crystal molecules 210 having an azimuth angle close to 0° than the LCD device according to the first comparative example, and the LCD device according to the exemplary embodiment of FIG. 1 has a higher percentage of liquid crystal molecules 210 having an azimuth angle close to 0° than the LCD device according to the second comparative example. That is, the LCD device according to the exemplary embodiment of FIG. 1 has the most improved visibility as compared to the LCD devices according to the first and second comparative examples.

When driven at a high gray level, the LCD device according to the second comparative example has a higher percentage of liquid crystal molecules 210 having an azimuth angle close to 45° than the LCD device according to the first comparative example, and the LCD device according to the exemplary embodiment of FIG. 1 has a higher percentage of liquid crystal molecules 210 having an azimuth angle close to 45° than the LCD device according to the second comparative example. That is, the LCD device according to the exemplary embodiment of FIG. 1 has the most improved transmittance as compared to the LCD devices according to the first and second comparative examples.

In other words, the visibility and transmittance of an LCD device may both be improved if the LCD device includes the pixel electrode 180 of FIG. 1, particularly, the second cutout portions 182 of FIG. 1.

Figure 6:
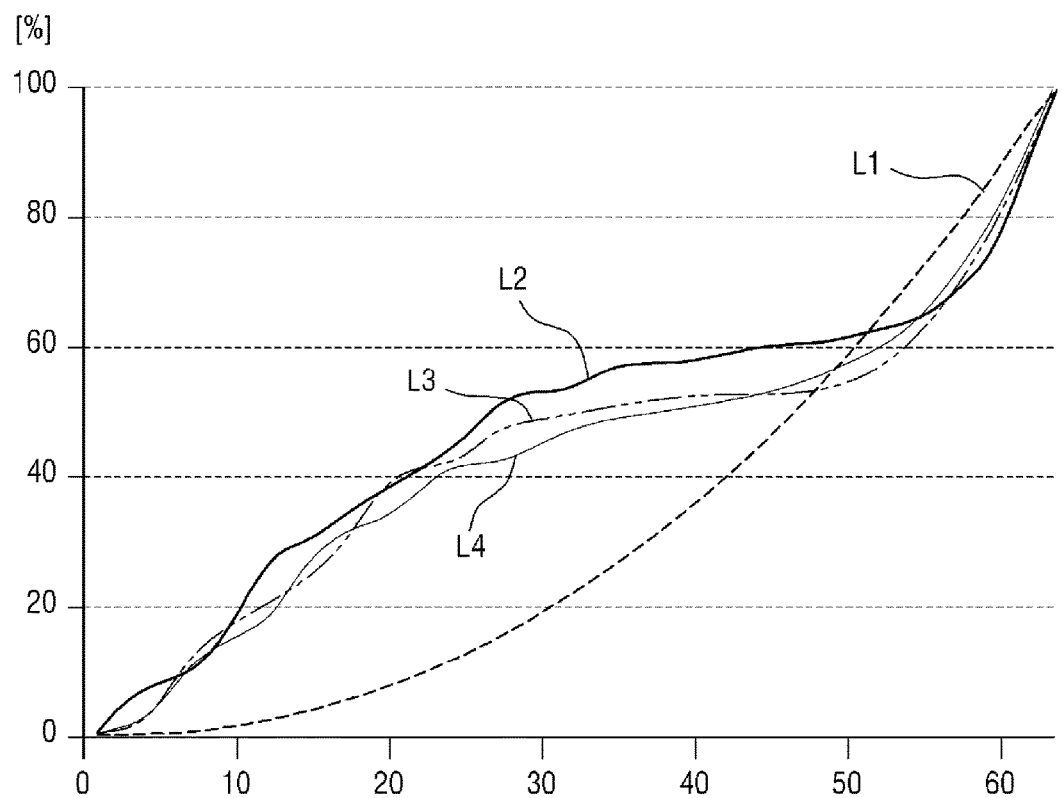
FIG. 6 is a graph showing improvements in the visibility of the LCD device according to the exemplary embodiment of FIG. 1, as compared to the LCD devices according to the first and second comparative examples.

FIG. 6 is a graph showing improvements in the visibility of the LCD device according to the exemplary embodiment of FIG. 1, as compared to the LCD devices according to the first and second comparative examples.

Referring to FIG. 6, the X axis represents the gray level of each pixel 10, and the Y axis represents brightness. A maximum level of the brightness represented by the Y axis is 100%, which is defined as the brightness of an LCD device having a gray level of 63 when the LCD device is viewed from the front.

A first line L1 represents the brightness, at each gray level, of the LCD device according to the first comparative example when the LCD device according to the first comparative example is viewed from the front, a second line L2 represents the brightness, at each gray level, of the LCD device according to the first comparative example when the LCD device according to the first comparative example is viewed from a side, a third line L3 represents the brightness, at each gray level, of the LCD device according to the second comparative example when the LCD device according to the second comparative example is viewed from a side, and a fourth line L4 represents the brightness, at each gray level, of the LCD device according to the exemplary embodiment of FIG. 1 when the LCD device according to the exemplary embodiment of FIG. 1 is viewed from a side.

It is apparent from FIG. 6 that the closer the brightness of an LCD device as viewed from the front is to the brightness of the LCD device as viewed from a side, the better the visibility of the LCD device becomes. That is, it may be interpreted that whichever of the second, third, and fourth lines L2, L3, and L4 is closest to the first line L1, especially, at a low gray level of 0 to 40, corresponds to the most favorable visibility.

As illustrated in FIG. 6, the fourth line L4 represents brightness measurements that are closest to those represented by the first line L1, and the brightness measurements represented by the fourth line L4 are even closer than those represented by the third and second lines L3 and L2 to those represented by the first line L1 at a low gray level of 0 to 40. Thus, the visibility of an LCD device corresponding to the brightness measurements represented by the fourth line L4, i.e., an LCD device including the pixel electrode 180 of FIG. 1, may be most favorable.

Figure 7:
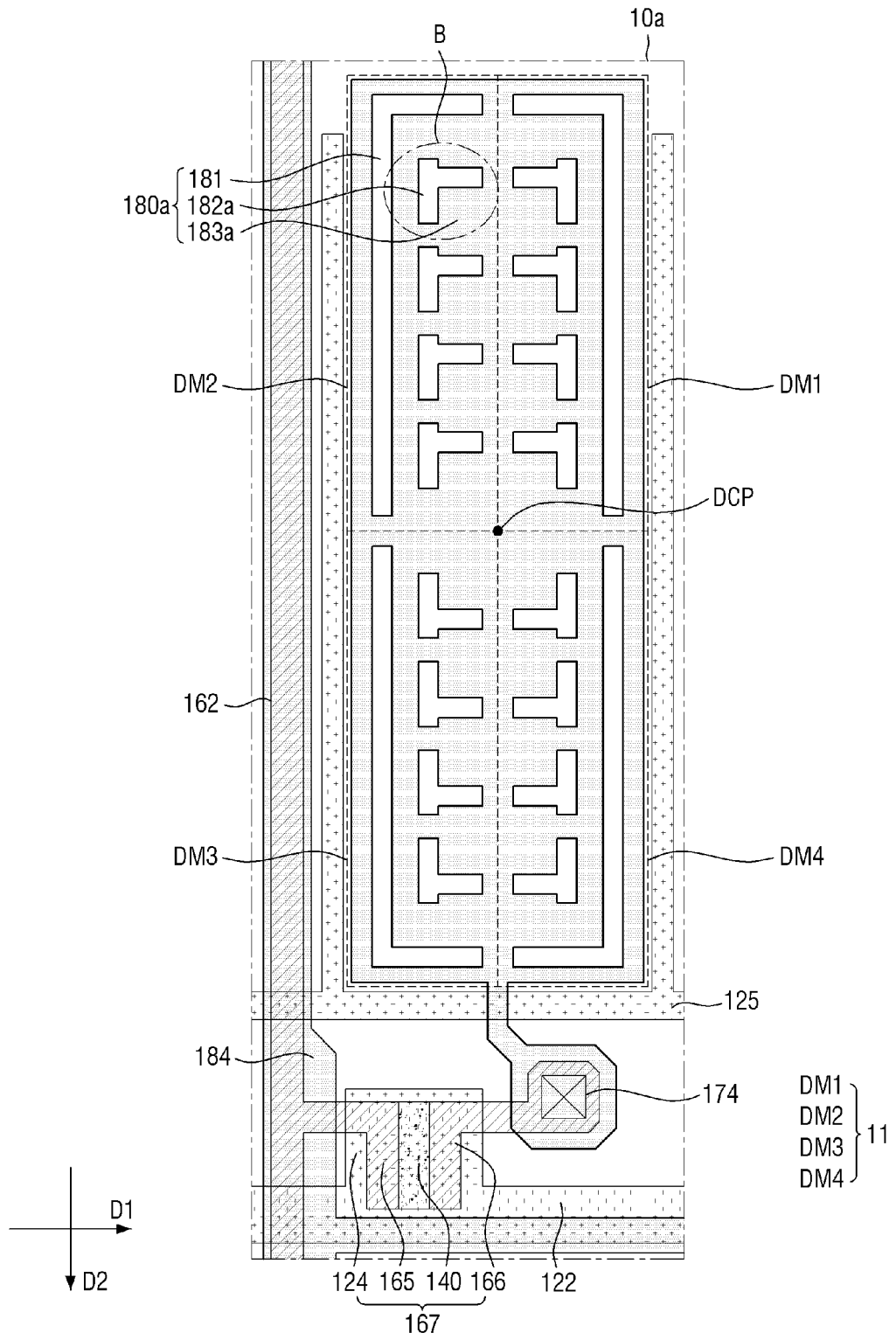
FIG. 7 is a plan view of a pixel of an LCD device according to a first modified exemplary embodiment.
Figure 8:
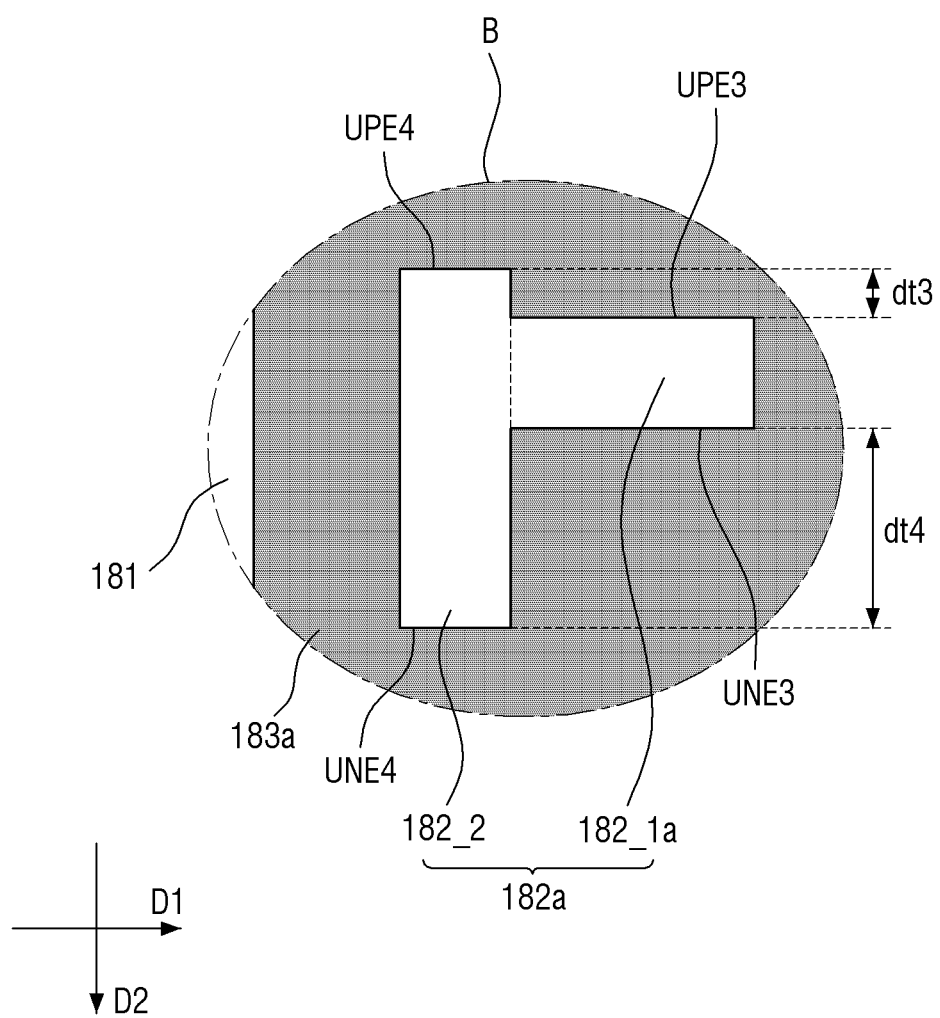
FIG. 8 is an enlarged plan view of an area B of FIG. 7.

FIG. 7 is a plan view of a pixel of the LCD device according to a first modified example of the present disclosure, and FIG. 8 is an enlarged plan view of an area B of FIG. 7.

Referring to FIGS. 7 and 8, a pixel 10a of an LCD device according to the present exemplary embodiment may include a gate line 122, a sustain line 125, a data line 162, a TFT 167, a contact hole 174, a pixel electrode 180a, and a shielding electrode 184.

The pixel 10a slightly differs from the pixel 10 of FIGS. 1 and 3 in the structure of the pixel electrode 180a, particularly, the relative arrangement of first and second extensions 182_1a and 182_2 of each second cutout portion 182a. The LCD device according to the present exemplary embodiment will hereinafter be described, focusing mainly on differences with the LCD device according to the exemplary embodiment of FIGS. 1 and 3.

The pixel electrode 180a may include an electrode portion 183a, first cutout portions 181, and second cutout portions 182a. Each of the second cutout portions 182a may include first and second extensions 182_1a and 182_2. In the present exemplary embodiment, unlike in the exemplary embodiment of FIGS. 1 and 3, the first extensions 182_1a may not be connected to the middle of the second extensions 182_2, respectively. That is, in the view of FIGS. 7 and 8, a length dt3 between upper ends UPE3 and UPE4 of the first and second extensions 182_1a of each of the second cutout portions 182a may differ from a length dt4 between lower ends UNE3 and UNE4 of the first and second extensions 182_1a and 182_2 of each of the second cutout portions 182a.

More specifically, in the view of FIGS. 7 and 8, in the first and second domains DM1 and DM2, the length between the lower ends UNE3 and UNE4 of the first and second extensions 182_1a and 182_2 of each of the second cutout portions 182a, i.e., the length dt4, may be longer than the length between the upper ends UPE3 and UPE4 of the first and second extensions 182_1a and 182_2 of each of the second cutout portions 182a, i.e., the length dt3. On the other hand, in the third and fourth domains DM3 and DM4, the length between the upper ends of the first and second extensions 182_1a and 182_2 of each of the second cutout portions 182a may be longer than the length between the lower ends of the first and second extensions 182_1a and 182_2 of each of the second cutout portions 182a.

According to the present exemplary embodiment, the force that tilts liquid crystal molecules 210 toward a domain center DCP may be strengthened in each region surrounded by the second cutout portions 182a. More specifically, in the first domain DM1, the liquid crystal molecules 210 may be tilted to the lower left in regions near the lower left sides of the second cutout portions 182a, in the second domain DM2, the liquid crystal molecules 210 may be tilted to the lower right in regions near the lower right sides of the second cutout portions 182a, in the third domain DM3, the liquid crystal molecules 210 may be tilted to the upper right in regions near the upper right sides of the second cutout portions 182a, and in the fourth domain DM4, the liquid crystal molecules 210 may be tilted to the upper left in regions near the upper left sides of the second cutout portions 182a. As a result, the number of liquid crystal molecules 210 having an azimuth angle close to 45° with respect to a direction in which the long axes of the liquid crystal molecules 210 are tilted may increase, and thus, an improvement in the transmittance of the LCD device according to the present exemplary embodiment may be maximized.

The LCD device according to the present exemplary embodiment is substantially the same as the LCD device of FIGS. 1 and 3 except for the above, and thus, a detailed description thereof will be omitted.

Figure 9:
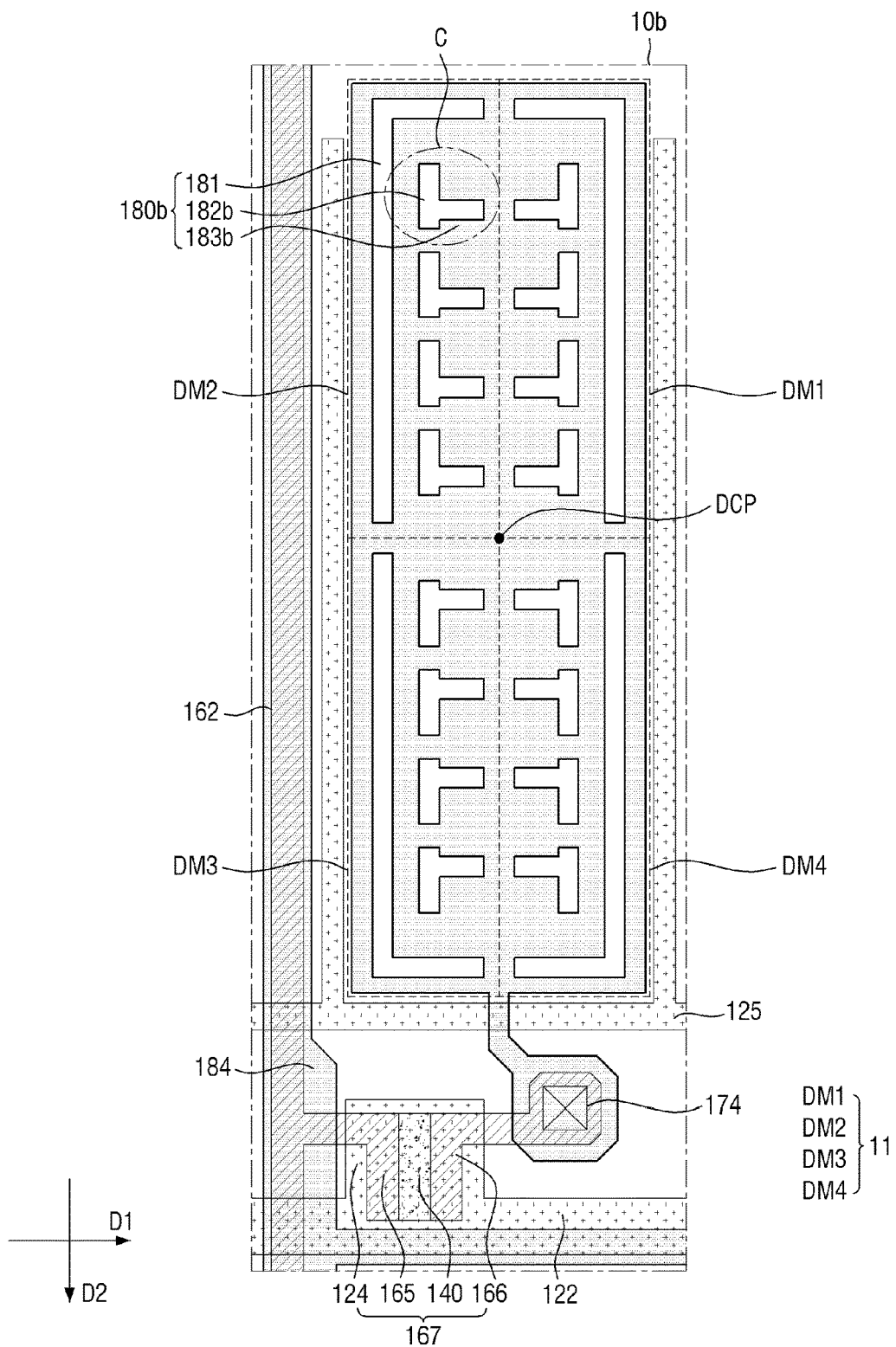
FIG. 9 is a plan view of a pixel of an LCD device according to a second modified exemplary embodiment.
Figure 10:
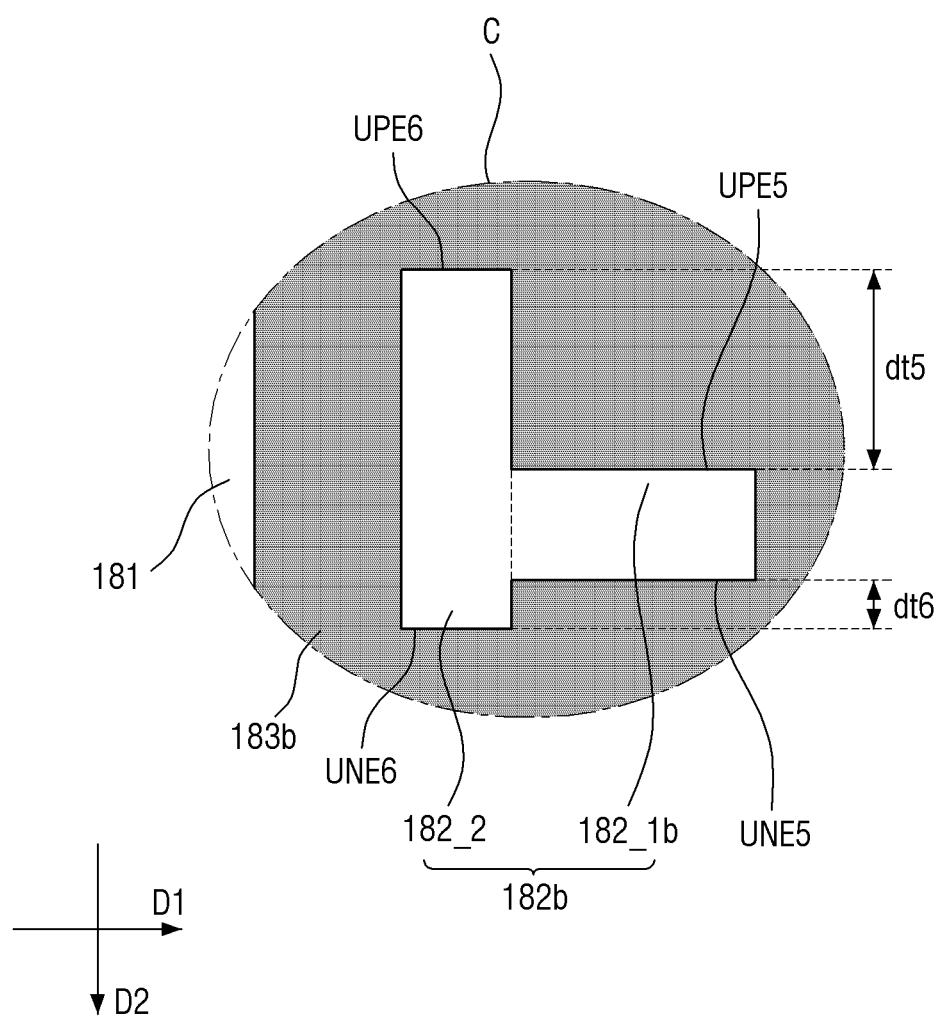
FIG. 10 is an enlarged plan view of an area C of FIG. 9.

FIG. 9 is a plan view of a pixel of an LCD device according to a second modified example of the present disclosure, and FIG. 10 is an enlarged plan view of an area C of FIG. 9.

Referring to FIGS. 9 and 10, a pixel 10b of the LCD device according to the present exemplary embodiment may include a gate line 122, a sustain line 125, a data line 162, a TFT 167, a contact hole 174, a pixel electrode 180b, and a shielding electrode 184.

The pixel 10b slightly differs from the pixel 10 of FIGS. 1 and 3 in the structure of the pixel electrode 180b, particularly, the relative arrangement of first and second extensions 182_1b and 182_2 of each second cutout portion 182b.

Thus, the LCD device according to the present exemplary embodiment will hereinafter be described, focusing mainly on differences with the LCD device according to the exemplary embodiment of FIGS. 1 and 3.

The pixel electrode 180b may include an electrode portion 183b, first cutout portions 181, and second cutout portions 182b. Each of the second cutout portions 182b may include first and second extensions 182_1b and 182_2. In the present exemplary embodiment, unlike in the exemplary embodiment of FIGS. 1 and 3, the first extensions 182_1b may not be connected to the middle of the second extensions 182_2, respectively. That is, a length dt5 between upper ends UPE5 and UPE6 of the first and second extensions 182_1b and 182_2 of each of the second cutout portions 182b may differ from a length dt6 between lower ends UNE5 and UNE6 of the first and second extensions 182_1b and 182_2 of each of the second cutout portions 182b.

More specifically, in the first and second domains DM1 and DM2, the length between the lower ends UNE5 and UNE6 of the first and second extensions 182_1b and 182_2 of each of the second cutout portions 182b, i.e., the length dt6, may be shorter than the length between the upper ends UPE5 and UPE6 of the first and second extensions 182_1b and 182_2 of each of the second cutout portions 182b, i.e., the length dt5. On the other hand, in third and fourth domains DM3 and DM4, the length between the upper ends of the first and second extensions 182_1b and 182_2 of each of the second cutout portions 182b may be shorter than the length between the lower ends of the first and second extensions 182_1b and 182_2 of each of the second cutout portions 182b.

According to the present exemplary embodiment, the force that tilts liquid crystal molecules 210 toward a first direction D1 may be strengthened in each region surrounded by the second cutout portions 182b. More specifically, in the first domain DM1, the liquid crystal molecules 210 may be tilted to the left in regions near the upper left sides of the second cutout portions 182b, in the second domain DM2, the liquid crystal molecules 210 may be tilted to the right in regions near the upper right sides of the second cutout portions 182b, in the third domain DM3, the liquid crystal molecules 210 may be tilted to the right in regions near the lower right sides of the second cutout portions 182b, and in the fourth domain DM4, the liquid crystal molecules 210 may be tilted to the left in regions near the lower left sides of the second cutout portions 182b. As a result, the number of liquid crystal molecules 210 having an azimuth angle close to 0° with respect to a direction in which the long axes of the liquid crystal molecules 210 are tilted may increase, and thus, an improvement in the transmittance of the LCD device according to the present exemplary embodiment may be maximized.

The LCD device according to the present exemplary embodiment is substantially the same as the LCD device of FIGS. 1 and 3 except for the above, and thus, a detailed description thereof will be omitted.

Figure 11:
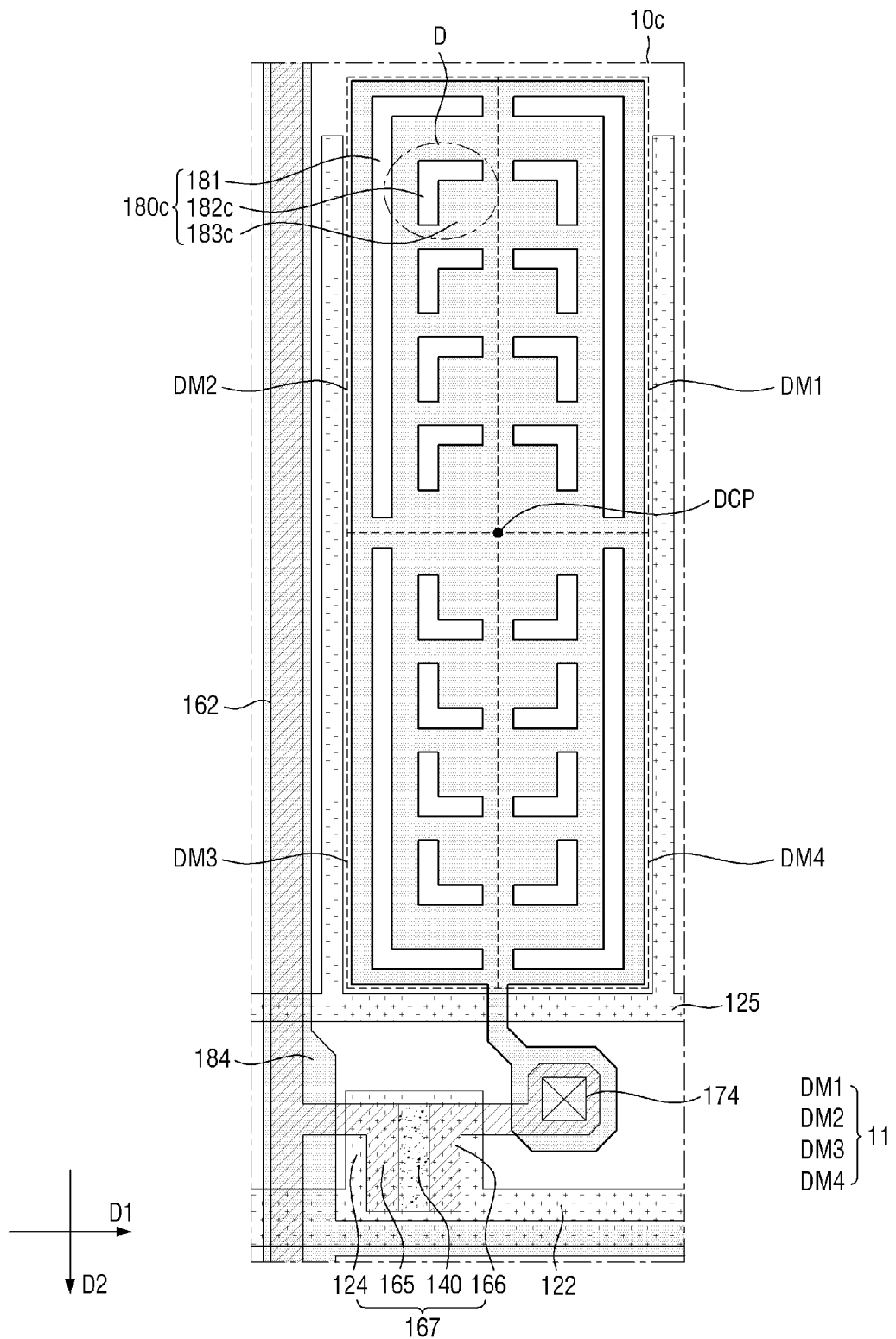
FIG. 11 is a plan view of a pixel of an LCD device according to a third modified exemplary embodiment.
Figure 12:
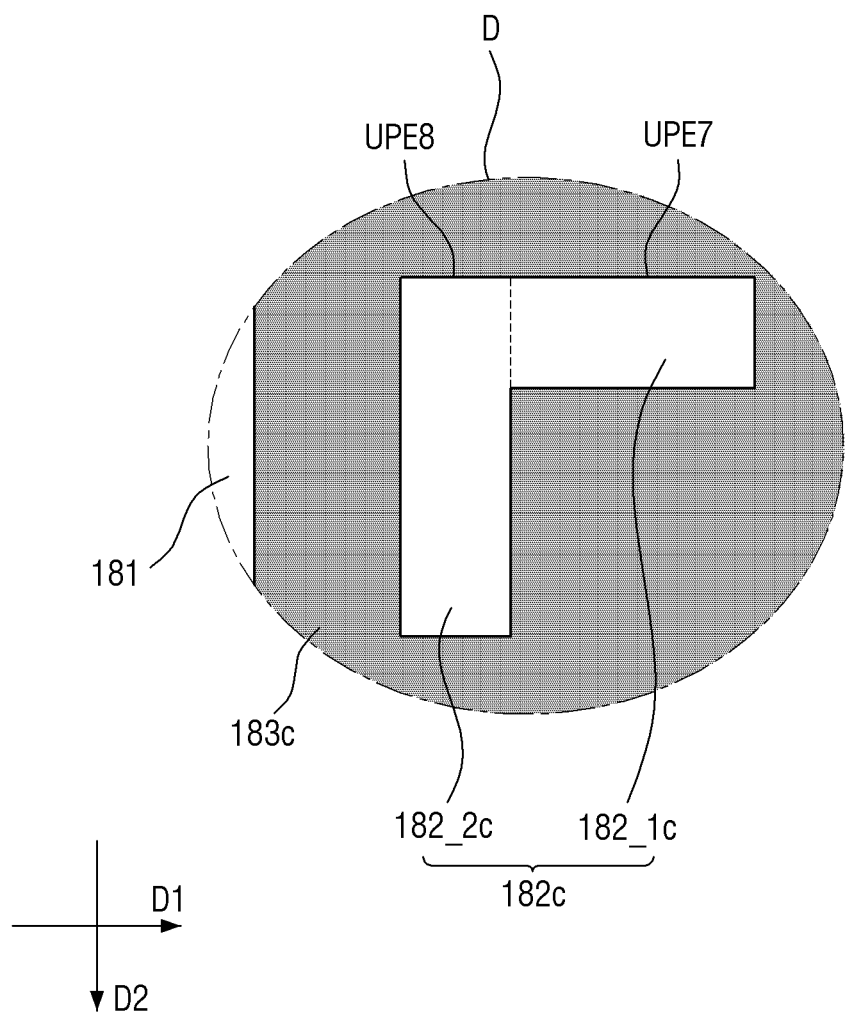
FIG. 12 is an enlarged plan view of an area D of FIG. 11.

FIG. 11 is a plan view of a pixel of an LCD device according to a third modified example of the present disclosure, and FIG. 12 is an enlarged plan view of an area D of FIG. 11.

Referring to FIGS. 11 and 12, a pixel 10c of the LCD device according to the present exemplary embodiment may include a gate line 122, a sustain line 125, a data line 162, a TFT 167, a contact hole 174, a pixel electrode 180c, and a shielding electrode 184.

The pixel 10c slightly differs from the pixel 10 of FIGS. 1 and 3 in the structure of the pixel electrode 180c, particularly, the relative arrangement of first and second extensions 182_1c and 182_2 of each second cutout portion 182c.

Thus, the LCD device according to the present exemplary embodiment will hereinafter be described, focusing mainly on differences with the LCD device according to the exemplary embodiment of FIGS. 1 and 3.

The pixel electrode 180c may include an electrode portion 183c, first cutout portions 181, and second cutout portions 182c. Each of the second cutout portions 182c may include first and second extensions 182_1c and 182_2. In the present exemplary embodiment, unlike in the exemplary embodiment of FIGS. 1 and 3, the first extensions 182_1c may not be connected to the middle of the second extensions 182_2, respectively. That is, the upper or lower ends of the first extensions 182_1c may be disposed on the same lines as upper or lower end of the second extensions 182_2, respectively.

More specifically, in the first and second domains DM1 and DM2, upper ends UPE7 of the first extensions 182_1c may be disposed on the same lines as upper ends UPE8 of the second extensions 182_2, respectively. In the third and fourth domains DM3 and DM4, the lower ends of the first extensions 182_1c may be disposed on the same lines as the lower ends of the second extensions 182_2, respectively.

According to the present exemplary embodiment, the force that tilts liquid crystal molecules 210 toward a domain center DCP may be further strengthened in each region surrounded by the second cutout portions 182c, as compared to the first modified example of FIGS. 7 and 8. As a result, the number of liquid crystal molecules 210 having an azimuth angle close to 45° with respect to a direction in which the long axes of the liquid crystal molecules 210 are tilted may increase, and thus, an improvement in the transmittance of the LCD device according to the present exemplary embodiment may be maximized.

The LCD device according to the present exemplary embodiment is substantially the same as the LCD devices of FIGS. 1 and 3 and 7 and 8 except for the above, and thus, a detailed description thereof will be omitted.

Figure 13:
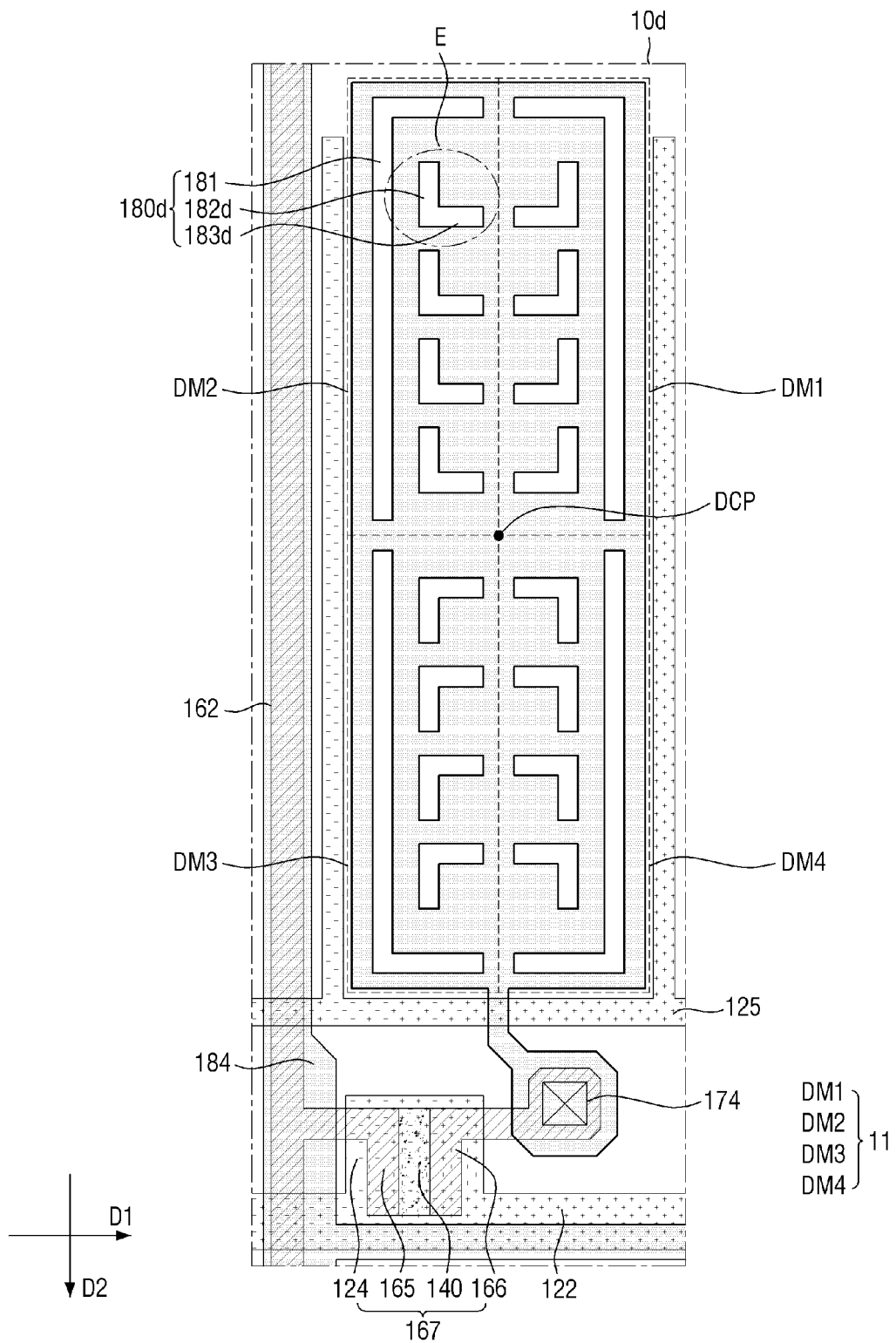
FIG. 13 is a plan view of a pixel of an LCD device according to a fourth modified exemplary embodiment.
Figure 14:
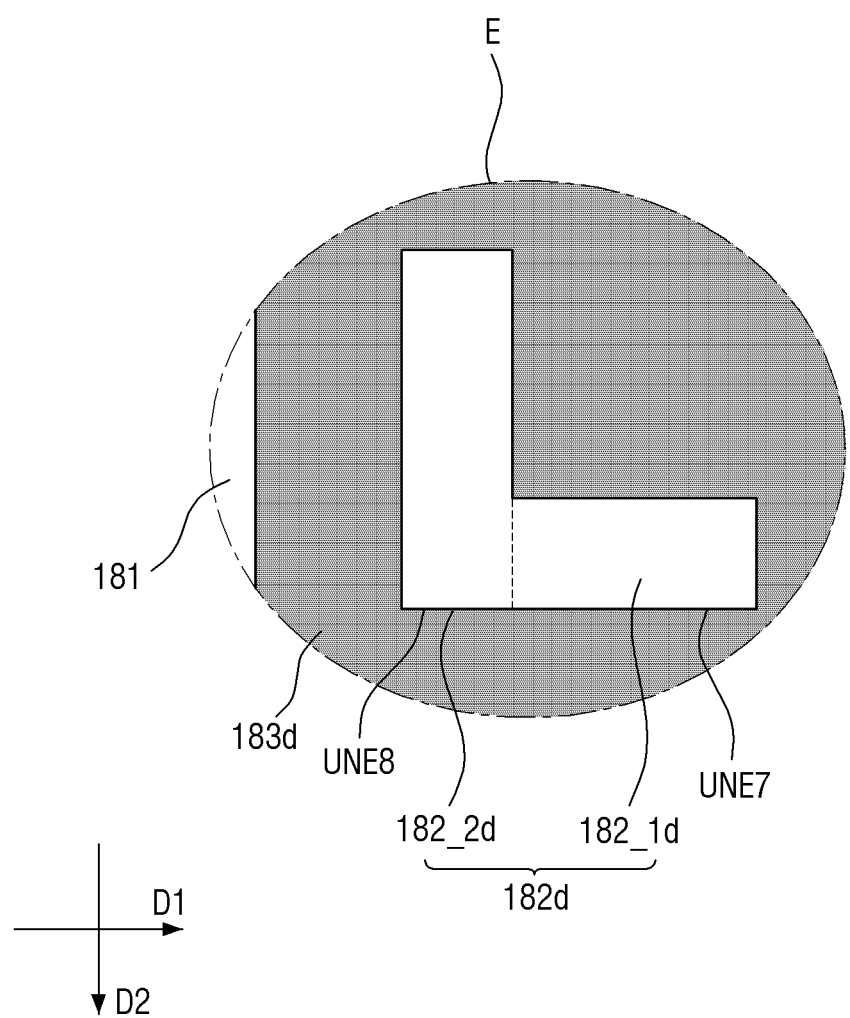
FIG. 14 is an enlarged plan view of an area E of FIG. 13.

FIG. 13 is a plan view of a pixel of an LCD device according to a fourth modified example of the present disclosure, and FIG. 14 is an enlarged plan view of an area E of FIG. 13.

Referring to FIGS. 13 and 14, a pixel 10d of the LCD device according to the present exemplary embodiment may include a gate line 122, a sustain line 125, a data line 162, a TFT 167, a contact hole 174, a pixel electrode 180d, and a shielding electrode 184.

The pixel 10d slightly differs from the pixel 10 of FIGS. 1 and 3 in the structure of the pixel electrode 180d, particularly, the relative arrangement of first and second extensions 182_1d and 182_2 of each second cutout portion 182d.

Thus, the LCD device according to the present exemplary embodiment will hereinafter be described, focusing mainly on differences with the LCD device according to the exemplary embodiment of FIGS. 1 and 3.

The pixel electrode 180d may include an electrode portion 183d, first cutout portions 181, and second cutout portions 182d. Each of the second cutout portions 182d may include first and second extensions 182_1d and 182_2. In the present exemplary embodiment, unlike in the exemplary embodiment of FIGS. 1 and 3, the first extensions 182_1d may not be connected to the middle of the second extensions 182_2, respectively. That is, the upper or lower ends of the first extensions 182_1d may be disposed on the same lines as upper or lower end of the second extensions 182_2, respectively.

More specifically, in the first and second domains DM1 and DM2, lower ends UNE7 of the first extensions 182_1d may be disposed on the same lines as lower ends UNE8 of the second extensions 182_2, respectively, and in the third and fourth domains DM3 and DM4, the upper ends of the first extensions 182_1d may be disposed on the same lines as the upper ends of the second extensions 182_2, respectively.

According to the present exemplary embodiment, the force that tilts liquid crystal molecules 210 toward a first direction D1 may be further strengthened in each region surrounded by the second cutout portions 182d, as compared to the second modified example of FIGS. 9 and 10. As a result, the number of liquid crystal molecules 210 having an azimuth angle close to 0° with respect to a direction in which the long axes of the liquid crystal molecules 210 are tilted may increase, and thus, an improvement in the transmittance of the LCD device according to the present exemplary embodiment may be maximized.

The LCD device according to the present exemplary embodiment is substantially the same as the LCD devices of FIGS. 1 and 3 and 9 and 10 except for the above, and thus, a detailed description thereof will be omitted.

Figure 15:
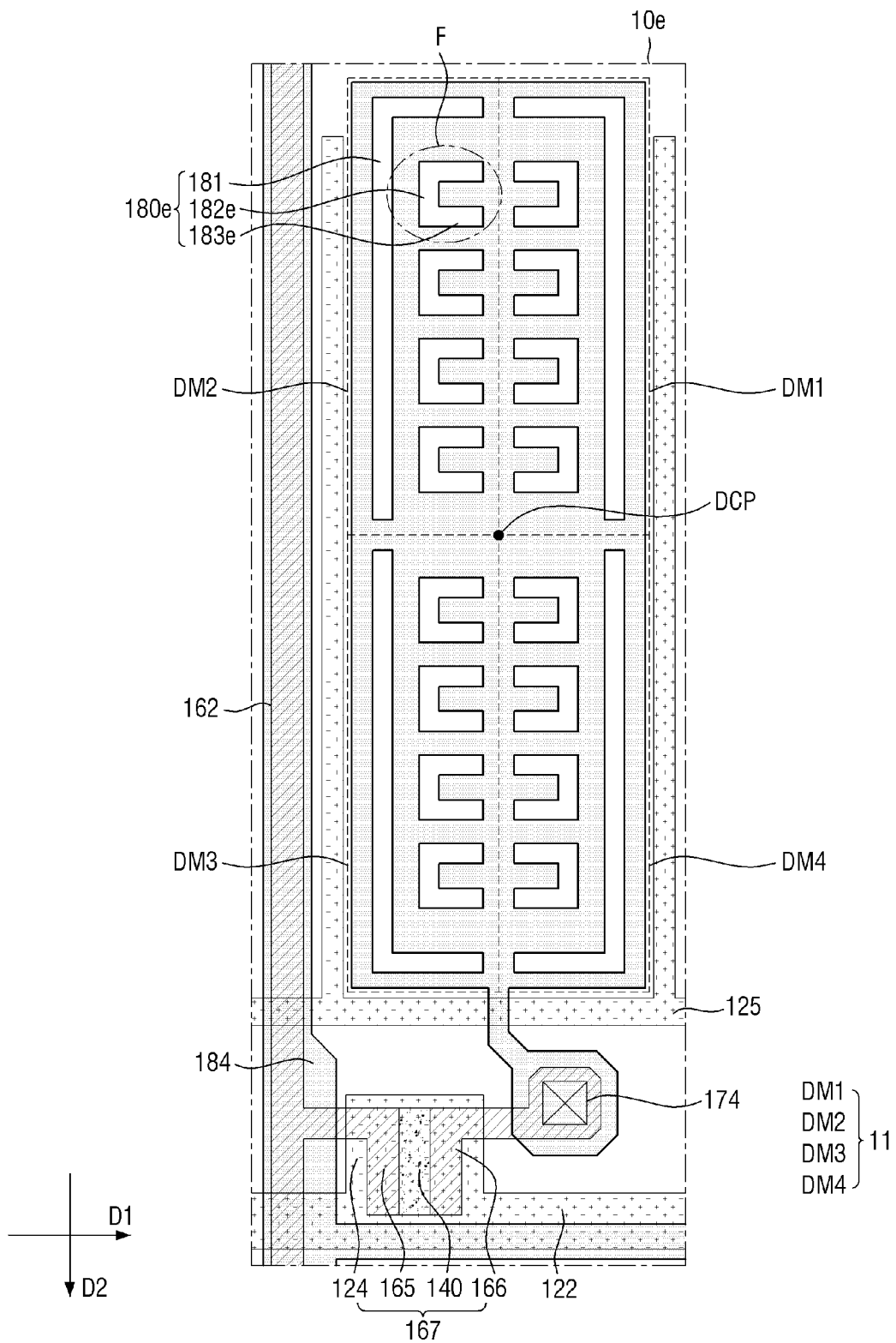
FIG. 15 is a plan view of a pixel of an LCD device according to a fifth modified exemplary embodiment.
Figure 16:
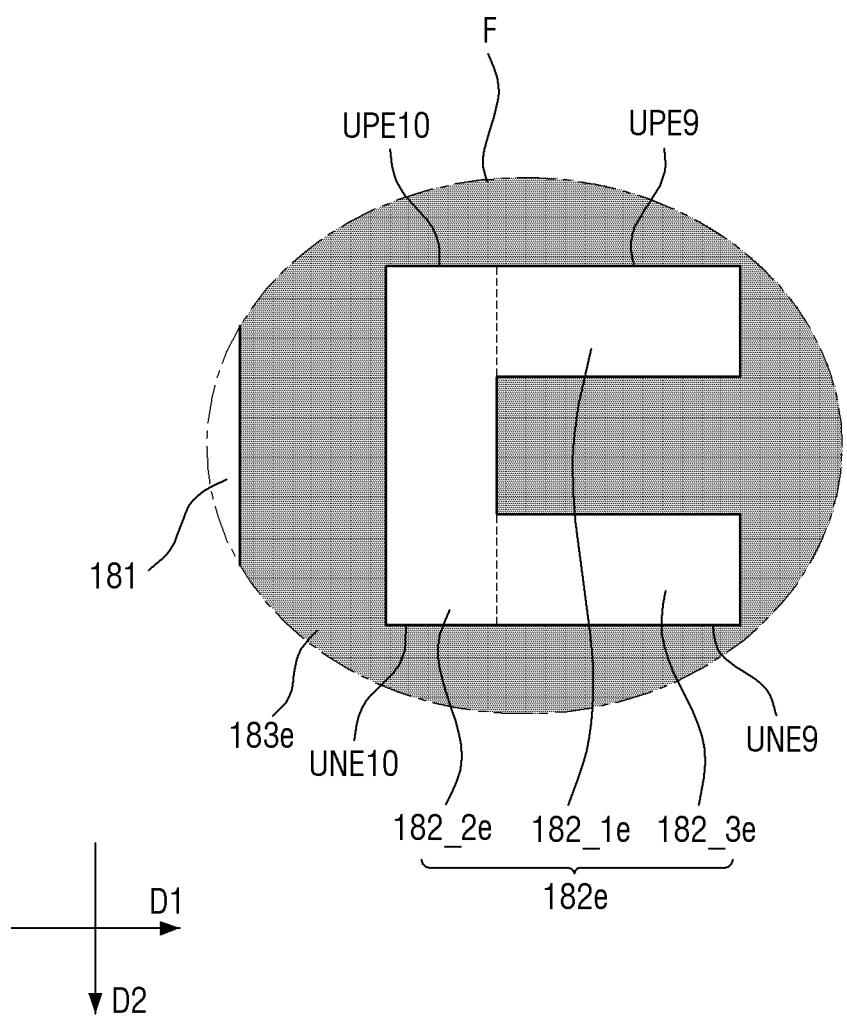
FIG. 16 is an enlarged plan view of an area F of FIG. 15.

FIG. 15 is a plan view of a pixel of an LCD device according to a fifth modified example of the present disclosure, and FIG. 16 is an enlarged plan view of an area F of FIG. 15.

Referring to FIGS. 15 and 16, a pixel 10e of the LCD device according to the present exemplary embodiment may include a gate line 122, a sustain line 125, a data line 162, a TFT 167, a contact hole 174, a pixel electrode 180e, and a shielding electrode 184.

The pixel 10e slightly differs from the pixel 10 of FIGS. 1 and 3 in the structure of the pixel electrode 180e. More specifically, the pixel 10e differs from the pixel 10 of FIGS. 1 and 3 in that each second cutout portion 182e of the pixel electrode 180e not only includes first and second extensions 182_1e and 182_2e, but also may include a third extension 182_3e.

Thus, the LCD device according to the present exemplary embodiment will hereinafter be described, focusing mainly on differences with the LCD device according to the exemplary embodiment of FIGS. 1 and 3.

The pixel electrode 180e may include an electrode portion 183e, first cutout portions 181, and second cutout portions 182e. Each of the second cutout portions 182e may include first, second, and third extensions 182_1e, 182_2e, and 182_3e. The first extensions 182_1e and the third extensions 182_3e may be openings extending in a first direction D1, and the second extensions 182_2e may be openings extending in a second direction D2. The second extensions 182_2e may connect the first extensions 182_1e, respectively, and the third extensions 182_3e, respectively. First ends of the first extensions 182_1e may be disposed on the same lines as first ends of the second extensions 182_2e, respectively, and first ends of the third extensions 182_3e may be disposed on the same lines as second ends of the second extensions 182_2e, respectively.

More specifically, in the view of FIGS. 15 and 16, in the first and second domains DM1 and DM2, upper ends UPE9 of the first extensions 182_1e may be disposed on the same lines as upper ends UPE10 of the second extensions 182_2e, respectively, and lower ends UNE9 of the third extensions 182_3e may be disposed on the same lines as lower ends UNE10 of the second extensions 182_2e, respectively. Also, in the third and fourth domains DM3 and DM4, the lower ends of the first extensions 182_1e may be disposed on the same lines as the lower ends of the second extensions 182_2e, respectively, and the upper ends of the third extensions 182_3e may be disposed on the same lines as the upper ends of the second extensions 182_2e, respectively.

According to the present exemplary embodiment, the number of openings extending in the first direction may increase, as compared to the previous exemplary embodiments of the present disclosure. Thus, the control of the pixel electrode 180e over liquid crystal molecules 210 may become relatively strong.

Figure 17:
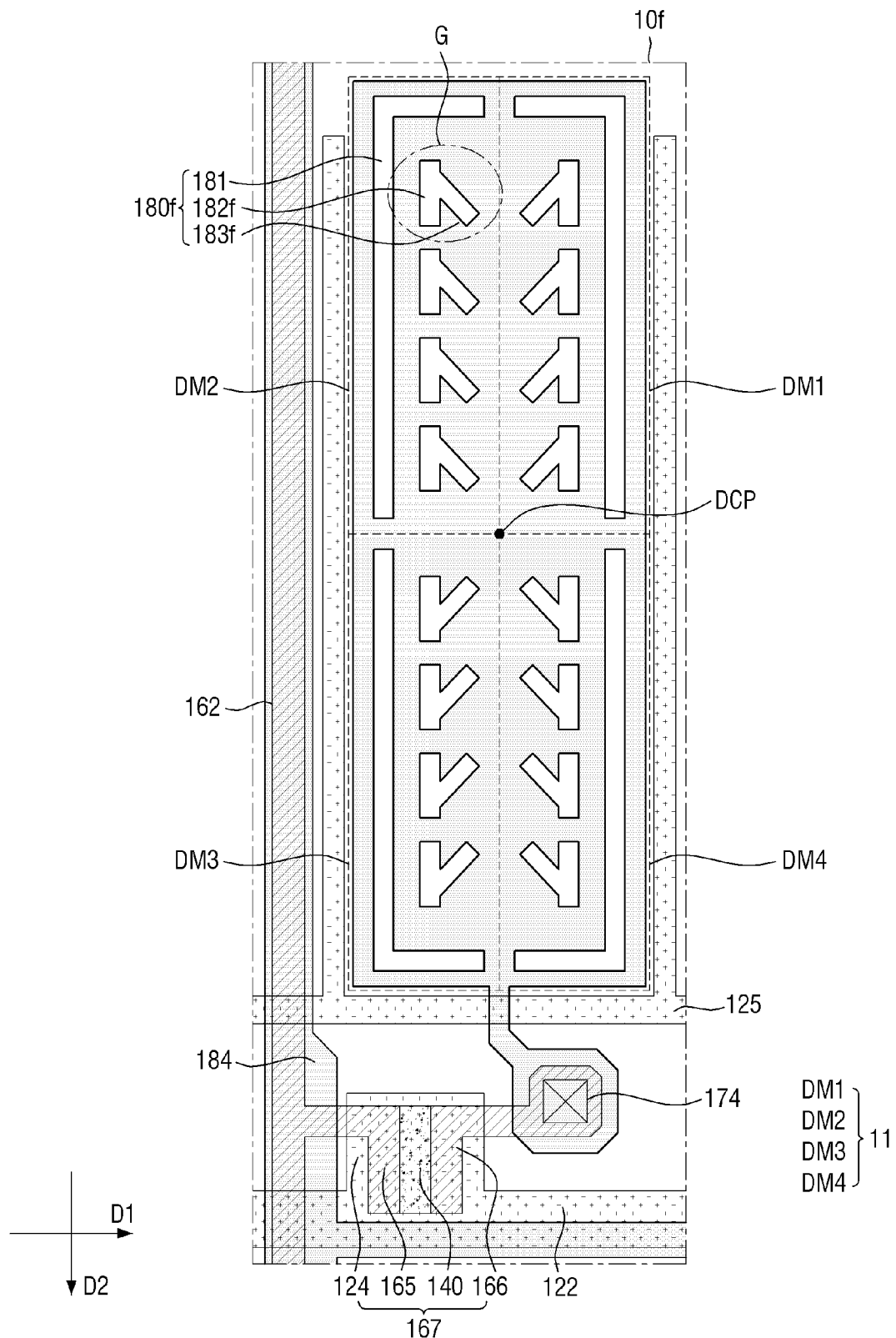
FIG. 17 is a plan view of a pixel of an LCD device according to a sixth modified exemplary embodiment.
Figure 18:
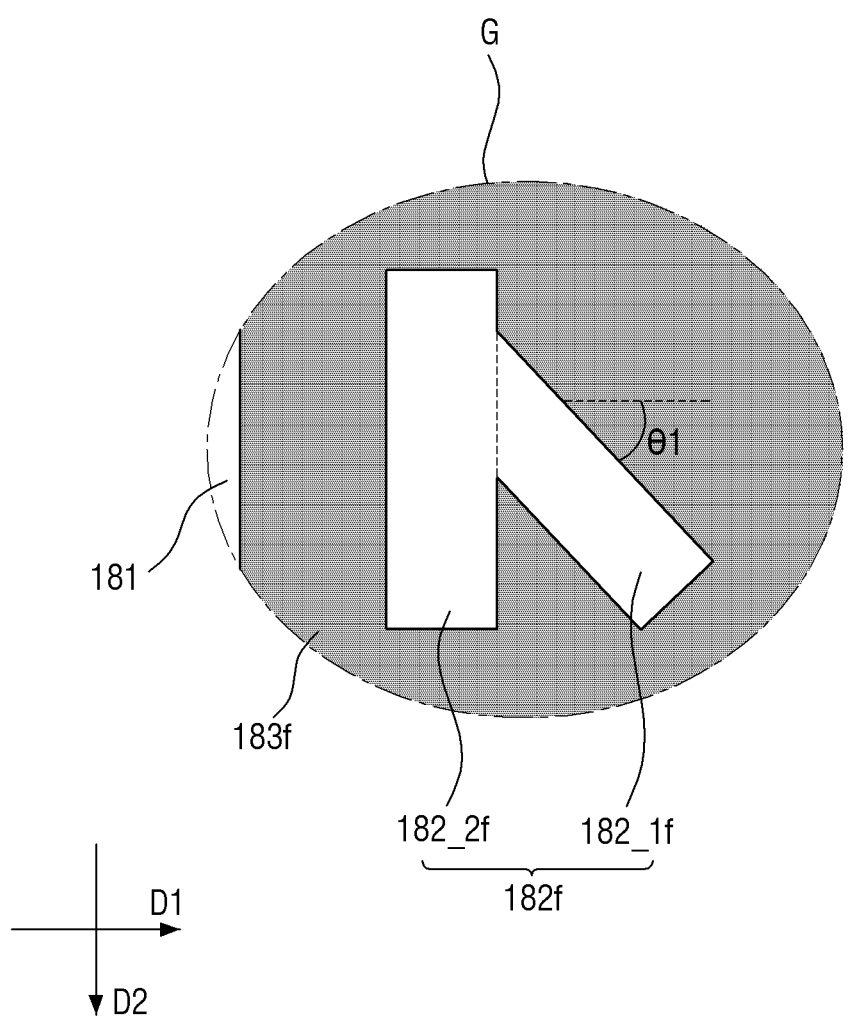
FIG. 18 is an enlarged plan view of an area G of FIG. 17.

FIG. 17 is a plan view of a pixel of an LCD device according to a sixth modified example of the present disclosure, and FIG. 18 is an enlarged plan view of an area G of FIG. 17.

Referring to FIGS. 17 and 18, a pixel 10f of the LCD device according to the present exemplary embodiment may include a gate line 122, a sustain line 125, a data line 162, a TFT 167, a contact hole 174, a pixel electrode 180*f*, and a shielding electrode 184.

The pixel 10*f* slightly differs from the pixel 10 of FIGS. 1 and 3 in the structure of the pixel electrode 180*f*. More specifically, the pixel 10*f* differs from the pixel 10 of FIGS. 1 and 3 in that a first extension 182_1*f* of each second cutout portion 182*f* extends in a direction different from a first direction D1.

Thus, the LCD device according to the present exemplary embodiment will hereinafter be described, focusing mainly on differences with the LCD device according to the exemplary embodiment of FIGS. 1 and 3.

The pixel electrode 180*f* may include an electrode portion 183*f*, first cutout portions 181, and second cutout portions 182*f*. Each of the second cutout portions 182*f* may include first and second extensions 182_1*f* and 182_2*f*. In the present exemplary embodiment, unlike in the exemplary embodiment of FIGS. 1 and 3, the first extensions 182_1*f* may be openings extending in a direction that forms a first angle θ1 with the first direction D1. The direction in which the first extensions 182_1*f* extend may be a direction toward a domain center DCP, and in each of first, second, third, and fourth domains DM1, DM2, DM3, and DM4, the first extensions 182_1*f* may extend in parallel to one another.

More specifically, the first extensions 182_1*f* in the first domain DM1 may be openings extending toward the lower left, the first extensions 182_1*f* in the second domain DM2 may be openings extending toward the lower right, the first extensions 182_1*f* in the third domain DM3 may be openings extending toward the upper right, and the first extensions 182_1*f* in the fourth domain DM4 may be openings extending toward the upper left. The first angle θ1 that the direction in which the first extensions 182 if extend forms with the first direction D1 may be in the range of 0° to 30°.

According to the present exemplary embodiment, the force that tilts liquid crystal molecules 210 near each region where the first extensions 182_1*f* are disposed may be strengthened, and thus, an improvement in the transmittance of the LCD device according to the present exemplary embodiment may be maximized.

The LCD device according to the present exemplary embodiment is substantially the same as the LCD device of FIGS. 1 and 3 except for the above, and thus, a detailed description thereof will be omitted.

Figure 19:
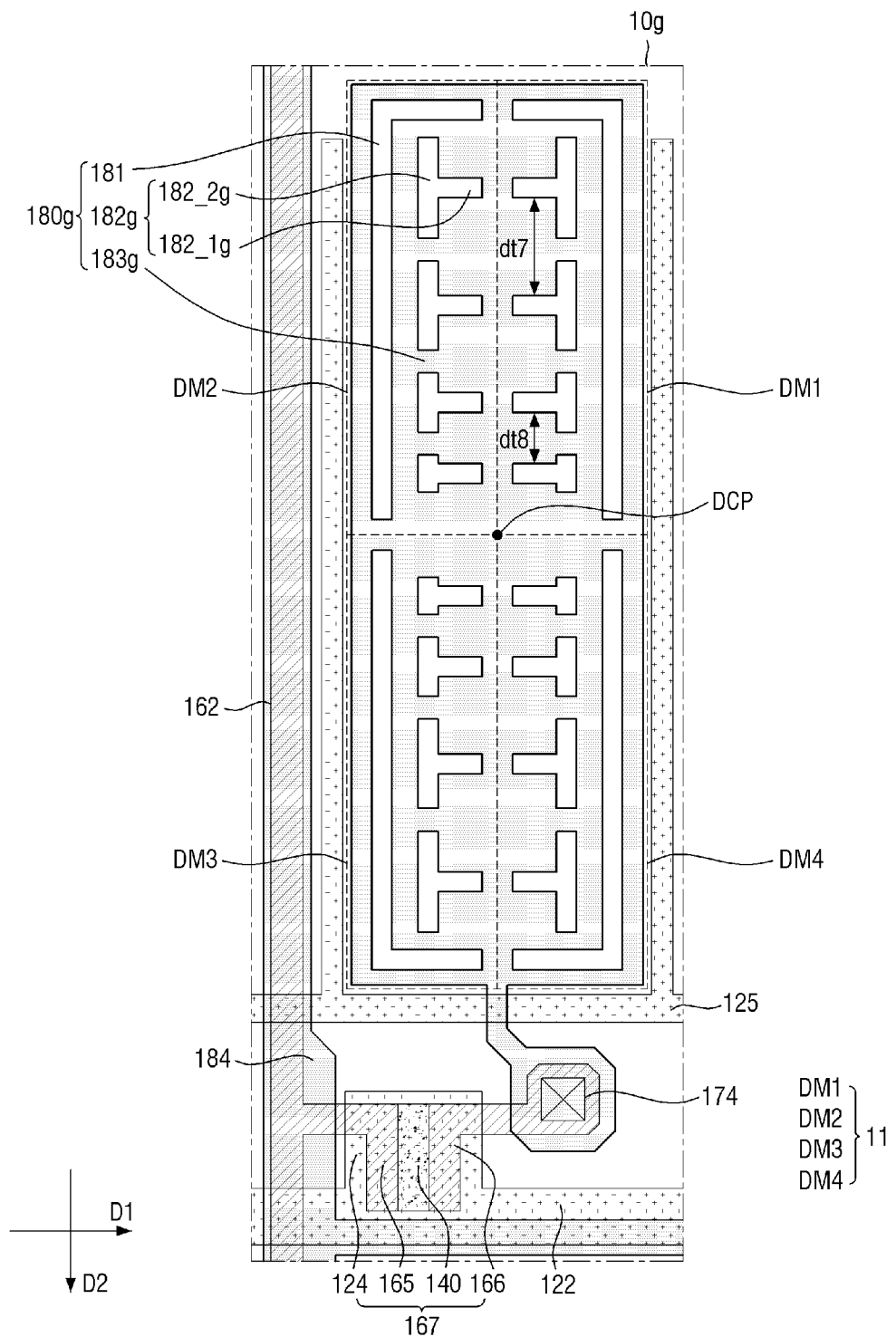
FIG. 19 is a plan view of a pixel of an LCD device according to a seventh modified exemplary embodiment.

FIG. 19 is a plan view of a pixel of an LCD device according to a seventh modified example of the present disclosure.

Referring to FIG. 19, a pixel 10*g* of the LCD device according to the present exemplary embodiment may include a gate line 122, a sustain line 125, a data line 162, a TFT 167, a contact hole 174, a pixel electrode 180*g*, and a shielding electrode 184.

The pixel 10*g* slightly differs from the pixel 10 of FIG. 1 in the structure of the pixel electrode 180*g*. More specifically, the pixel 10*g* differs from the pixel 10 of FIG. 1 in that the length of second extensions 182_2*g* of second cutout portions 182*g* may vary from one location to another location.

Thus, the LCD device according to the present exemplary embodiment will hereinafter be described, focusing mainly on differences with the LCD device according to the exemplary embodiment of FIG. 1.

The pixel electrode 180*g* may include an electrode portion 183*g*, first cutout portions 181, and the second cutout portions 182*g*. Each of the second cutout portions 182*g* may include first and second extensions 182_1*g* and 182_2*g*. In the present exemplary embodiment, unlike in the exemplary embodiment of FIGS. 1 and 3, the length of the second extensions 182_2*g* varies from one location to another location in each of first, second, third, and fourth domains DM1, DM2, DM3, and DM4. More specifically, the closer the second extensions 182_2*g* are to a domain center DCP, the shorter the second extensions 182_2*g* relatively become, and the more distant the second extensions 182_2*g* are from the domain center DCP, the longer the second extensions 182_2*g* relatively become.

That is, in the view of FIG. 19, second extensions 182_2*g* close to the upper sides of the first and second domains DM1 and DM2 are longer than second extensions 182_2*g* close to the lower sides of the first and second domains DM1 and DM2. Similarly, second extensions 182_2*g* close to the lower sides of the third and fourth domains DM3 and DM4 are longer than second extensions 182_2*g* close to the upper sides of the third and fourth domains DM3 and DM4.

Since the length of the second extensions 182_2*g* varies from one location to another location in each of the first, second, third, and fourth domains DM1, DM2, DM3, and DM4, the distance between a pair of adjacent first extensions 182_1*g* may also vary from one location to another in each of the first, second, third, and fourth domains DM1, DM2, DM3, and DM4. That is, a distance dt7 between two adjacent first extensions 182_1*g* from the upper side of each of the first and second domains DM1 and DM2 may be longer than a distance dt8 between two adjacent first extensions 182_1*g* from the lower side of each of the first and second domains DM1 and DM2. Similarly, the distance between two adjacent first extensions 182_1*g* from the lower side of each of the third and fourth domains DM3 and DM4 may be longer than the distance between two adjacent first extensions 182_1*g* from the upper side of each of the third and fourth domains DM3 and DM4.

According to the present exemplary embodiment, the azimuth angle that the long axes of liquid crystal molecules 210 in an active region 11 form with the first direction D1 may vary from one region to another region. Thus, the display quality of the LCD device according to the present exemplary embodiment may be improved.

Figure 20:
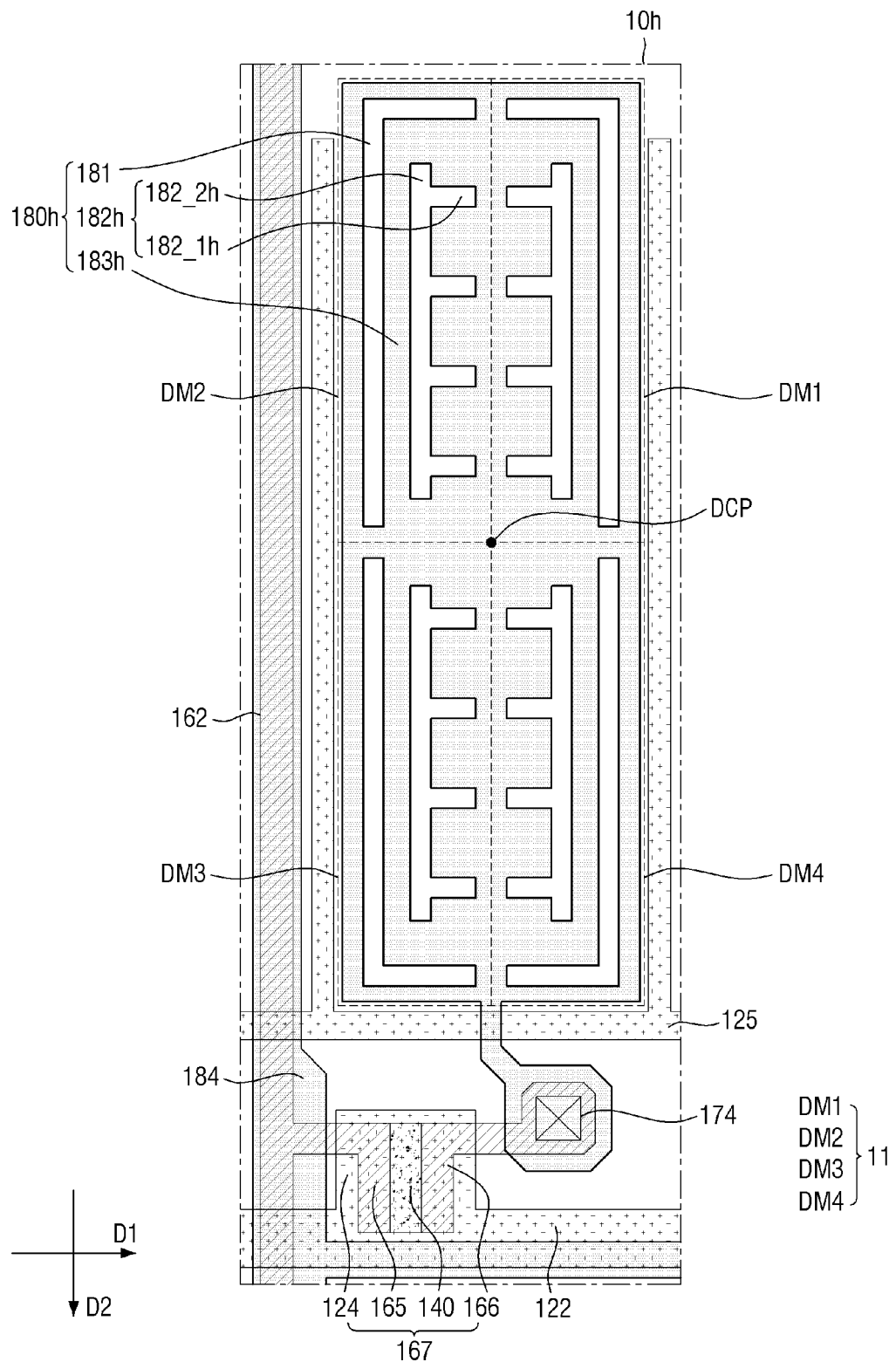
FIG. 20 is a plan view of a pixel of an LCD device according to an eighth modified exemplary embodiment.

FIG. 20 is a plan view of a pixel of an LCD device according to an eighth modified example of the present disclosure.

Referring to FIG. 20, a pixel 10*h* of the LCD device according to the present exemplary embodiment may include a gate line 122, a sustain line 125, a data line 162, a TFT 167, a contact hole 174, a pixel electrode 180*h*, and a shielding electrode 184.

The pixel 10*h* slightly differs from the pixel 10 of FIG. 1 in the structure of the pixel electrode 180*h*. More specifically, the pixel 10*h* differs from the pixel 10 of FIG. 1 in that each second extension 182*h* may include a plurality of first extensions 182_1*h* and a second extension 182_2*h*.

Thus, the LCD device according to the present exemplary embodiment will hereinafter be described, focusing mainly on differences with the LCD device according to the exemplary embodiment of FIG. 1.

The pixel electrode 180*h* may include an electrode portion 183*h*, first cutout portions 181, and second cutout portions 182*h*. In the present exemplary embodiment, unlike in the exemplary embodiment of FIGS. 1 and 3, each of first, second, third, and fourth domains DM1, DM2, DM3, and DM4 may be provided with one second cutout portion 182*h*. Each of the second cutout portions 182*h* may include a plurality of first extensions 182_1*h*, which extend in a first direction D1 in parallel to one another, and a second extension 182_2*h*, which connects the ends of the plurality of first extensions 182_1*h*. Accordingly, the area of the second extensions 182_2*h* may increase, as compared to the exemplary embodiment of FIGS. 1 and 3.

According to the present exemplary embodiment, the area of the second extensions 182_2*h*, which extend in a second direction D2, may increase, and thus, the force that tilts liquid crystal molecules 210 in the first direction D1 may be strengthened. As a result, the number of liquid crystal molecules 210 having an azimuth angle close to 0° with respect to a direction in which the long axes of the liquid crystal molecules 210 are tilted may increase, and thus, an improvement in the transmittance of the LCD device according to the present exemplary embodiment may be maximized.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A liquid crystal display (LCD) device, comprising:
a substrate; and
a pixel electrode disposed on the substrate, wherein the pixel electrode comprises first cutout portions and second cutout portions which are separate from each other,
wherein the first cutout portions comprise:
a first sub cutout portion which comprises a first outer extension portion extending in a first direction and a second outer extension portion extending from the first outer extension portion in a second direction which is different from the first direction, and
a second sub cutout portion separate from the first sub cutout portion which comprises a third outer extension portion extending in the first direction and a fourth outer extension portion extending from the third outer extension portion in the second direction,
wherein the second cutout portions are disposed between the second outer extension portion of the first sub cutout portion and the fourth outer extension portion of the second sub cutout portion,
wherein each of the second cutout portions comprises a first extension and a second extension connected to the first extension,
wherein each second extension extends in the second direction, and
wherein the first direction is perpendicular to the second direction, and
wherein the LCD device further comprises:
a gate line disposed between the substrate and the pixel electrode and extending in the first direction; and
a data line disposed on a layer between a layer in which the gate line is disposed and a layer in which the pixel electrode is disposed and extending in the second direction.

2. The LCD device of claim 1, wherein the second extension is disposed closer than the first extension to a corresponding edge of the pixel electrode and extends in a direction parallel to a corresponding first cutout portion.

3. The LCD device of claim 1, wherein the first extension extends in the first direction.

4. The LCD device of claim 3, wherein in a plan view, a length between upper ends of the first and second extensions is the same as a length between lower ends of the first and second extensions.

5. The LCD device of claim 3, wherein the pixel electrode is divided into four quadrants comprising
a first domain disposed on an upper right side of the pixel electrode,
a second domain disposed on an upper left side of the pixel electrode,
a third domain disposed on a lower left side of the pixel electrode, and
a fourth domain disposed on a lower right side of the pixel electrode.

6. The LCD device of claim 5, wherein
a plurality of second extensions disposed in the first domain are disposed on a first extension line,
a plurality of second extensions disposed in the second domain are disposed on a second extension line,
a plurality of second extensions disposed in the third domain are disposed on a third extension line, and
a plurality of second extensions disposed in the fourth domain are disposed on a fourth extension line.

7. The LCD device of claim 5, wherein a number of second cutout portions is the same in all of the first, second, third, and fourth domains.

8. The LCD device of claim 7, wherein the first, second, third, and fourth extension lines either overlap one another or are parallel to one another.

9. The LCD device of claim 5, wherein in a plan view, a length between upper ends of the first and second extensions is different from a length between lower ends of the first and second extensions.

10. The LCD device of claim 9, wherein
in the first and second domains, the length between the lower ends of the first and second extensions is longer than the length between the upper ends of the first and second extensions in a plan view, and
in the third and fourth domains, the length between the upper ends of the first and second extensions is longer than the length between the lower ends of the first and second extensions in a plan view.

11. The LCD device of claim 9, wherein
in the first and second domains, the length between the lower ends of the first and second extensions is shorter than the length between the upper ends of the first and second extensions in a plan view, and
in the third and fourth domains, the length between the upper ends of the first and second extensions is shorter than the length between the lower ends of the first and second extensions in a plan view.

12. The LCD device of claim 5, wherein
in the first and second domains, upper ends of the first and second extensions are connected in a plan view, and
in the third and fourth domains, lower ends of the first and second extensions are connected in a plan view.

13. The LCD device of claim 5, wherein
in the first and second domains, lower ends of the first and second extensions are connected in a plan view, and
in the third and fourth domains, upper ends of the first and second extensions are connected in a plan view.

14. The LCD device of claim 5, wherein the pixel electrode is symmetrical with respect to a domain center at which the first, second, third, and fourth domains adjoin one another.

15. The LCD device of claim 3, wherein in a plan view, the closer the second extension is to an upper or lower end of the pixel electrode and away from a center of the pixel electrode, the longer the second extension becomes.

16. The LCD device of claim 3, wherein
each of the second cutout portions further comprises a third extension, which extends in the direction in which the first extension extends,
upper ends of the first and second extensions are connected, and
a lower end of the third extension is connected to a lower end of the second extension.

17. A liquid crystal display (LCD) device, comprising:
a substrate; and
a pixel electrode including a first outer edge extending in a first direction and a second outer edge extending in the second direction which is different from the first direction, the pixel electrode disposed on the substrate, wherein
the pixel electrode comprises first cutout portions and second cutout portions which are separate from each other,
wherein the first cutout portions comprise:
a first sub cutout portion which comprises a first outer extension portion extending in the first direction and a second outer extension portion extending from the first outer extension portion in the second direction, and
a second sub cutout portion separate from the first sub cutout portion which comprises a third outer extension portion extending in the first direction and a fourth outer extension portion extending from the third outer extension portion in the second direction,
wherein the second cutout portions are disposed between the second outer extension portion of the first sub cutout portion and the fourth outer extension portion of the second sub cutout portion, and
wherein each of the second cutout portions comprises a plurality of first extensions which extend in the first direction in parallel to one another and are spaced apart from one another, and a second extension is connected to first ends of the first extensions and extends in the second direction, wherein the second direction is perpendicular to the first direction.

18. The LCD device of claim 17, wherein
the pixel electrode is divided into four quadrants comprising
a first domain which is disposed on an upper right side of the pixel electrode,
a second domain which is disposed on an upper left side of the pixel electrode,
a third domain which is disposed on a lower left side of the pixel electrode, and
a fourth domain which is disposed on a lower right side of the pixel electrode,
wherein each of the first, second, third, and fourth domains is provided with one second cutout portion, and
the second cutout portions are symmetrical with respect to a domain center at which the first, second, third, and fourth domains adjoin one another.

* * * * *